US012787796B2

(12) United States Patent
Lee et al.

(10) Patent No.: US 12,787,796 B2
(45) Date of Patent: Nov. 3, 2026

(54) PACKAGE-ON-PACKAGE (POP) TYPE SEMICONDUCTOR PACKAGES

(71) Applicant: Samsung Electronics Co., Ltd., Suwon-si (KR)

(72) Inventors: Minho Lee, Cheonan-si (KR); Jaewook Yoo, Asan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 901 days.

(21) Appl. No.: 18/185,526

(22) Filed: Mar. 17, 2023

(65) Prior Publication Data

US 2023/0223387 A1 Jul. 13, 2023

Related U.S. Application Data

(63) Continuation of application No. 16/874,722, filed on May 15, 2020, now Pat. No. 11,610,871.

(30) Foreign Application Priority Data

Sep. 10, 2019 (KR) ........................ 10-2019-0112368

(51) Int. Cl.
*H10W 46/00* (2026.01)
*B81C 99/00* (2010.01)
(Continued)

(52) U.S. Cl.
CPC ......... *H10W 46/607* (2026.01); *B81C 99/007* (2013.01); *H10P 72/53* (2026.01);
(Continued)

(58) Field of Classification Search
CPC ............. H10W 46/301; H10W 46/603; H10W 46/607; H10W 70/09; H10W 70/655;
(Continued)

(56) References Cited

U.S. PATENT DOCUMENTS 5,796,868 A 8/1998 Dutta-Choudhury
7,238,548 B2 7/2007 Kurita et al.
(Continued)

FOREIGN PATENT DOCUMENTS

CN 1585123 A 2/2005
CN 101419954 A 4/2009
(Continued)

*Primary Examiner* — Marcos D. Pizarro
(74) *Attorney, Agent, or Firm* — Wolf, Greenfield & Sacks, P.C.

(57) ABSTRACT

Provided are package-on-package (POP)-type semiconductor packages including a lower package having a first size and including a lower package substrate in which a lower semiconductor chip is, an upper redistribution structure on the lower package substrate and the lower semiconductor chip, and alignment marks. The packages may also include an upper package having a second size smaller than the first size and including an upper package substrate and an upper semiconductor chip. The upper package substrate may be mounted on the upper redistribution structure of the lower package and electrically connected to the lower package, and the upper semiconductor chip may be on the upper package substrate. The alignment marks may be used for identifying the upper package, and the alignment marks may be below and near outer boundaries of the upper package on the lower package.

15 Claims, 20 Drawing Sheets

(51) Int. Cl.

| | |
|---|---|
| ***H10P 72/50*** | (2026.01) |
| ***H10W 70/05*** | (2026.01) |
| ***H10W 70/09*** | (2026.01) |
| ***H10W 70/60*** | (2026.01) |
| ***H10W 70/65*** | (2026.01) |
| ***H10W 70/655*** | (2026.01) |
| ***H10W 70/68*** | (2026.01) |
| ***H10W 70/685*** | (2026.01) |
| ***H10W 70/695*** | (2026.01) |
| ***H10W 72/00*** | (2026.01) |
| ***H10W 72/90*** | (2026.01) |
| ***H10W 74/10*** | (2026.01) |
| ***H10W 80/00*** | (2026.01) |
| ***H10W 90/00*** | (2026.01) |

(52) U.S. Cl.

CPC ......... *H10W 46/00* (2026.01); *H10W 46/301* (2026.01); *H10W 46/603* (2026.01); *H10W 70/05* (2026.01); *H10W 70/09* (2026.01); *H10W 70/65* (2026.01); *H10W 70/655* (2026.01); *H10W 70/68* (2026.01); *H10W 70/682* (2026.01); *H10W 70/685* (2026.01); *H10W 70/695* (2026.01); *H10W 72/985* (2026.01); *H10W 74/117* (2026.01); *H10W 80/163* (2026.01); *H10W 90/00* (2026.01); *H10W 90/701* (2026.01); *H10W 90/724* (2026.01); *H10W 90/7295* (2026.01); *H10W 90/734* (2026.01); *H10W 90/754* (2026.01); *H10W 46/101* (2026.01); *H10W 70/60* (2026.01); *H10W 72/07178* (2026.01); *H10W 90/722* (2026.01)

(58) Field of Classification Search

CPC ............. H10W 70/682; H10W 70/695; H10W 72/985; H10W 74/117; H10W 90/724; H10W 90/7295; H10W 90/734; H10W 90/754; H10W 80/163; H10P 72/53

See application file for complete search history.

(56) References Cited

U.S. PATENT DOCUMENTS

| | | | |
|---|---|---|---|
| 8,253,228 | B2 | 8/2012 | Kim et al. |
| 8,629,568 | B2 | 1/2014 | Lin et al. |
| 8,841,783 | B2 | 9/2014 | Wakiyama |
| 9,196,608 | B2 | 11/2015 | Foong et al. |
| 9,230,876 | B2 | 1/2016 | Lee et al. |
| 9,478,523 | B2 | 10/2016 | Lee |
| 9,611,143 | B2 | 4/2017 | Ho et al. |
| 9,613,857 | B2 | 4/2017 | Chen et al. |
| 9,839,127 | B2 | 12/2017 | Kwon et al. |
| 10,153,219 | B2 | 12/2018 | Jeon et al. |
| 10,163,807 | B2 | 12/2018 | Chen et al. |
| 10,347,613 | B1 | 7/2019 | Kim et al. |
| 11,114,407 | B2 | 9/2021 | Wang et al. |
| 2014/0284780 | A1 | 9/2014 | Kinoshita |
| 2015/0348904 | A1 | 12/2015 | Huang et al. |
| 2016/0260685 | A1 | 9/2016 | Tremlett et al. |
| 2017/0040293 | A1 | 2/2017 | Kim et al. |
| 2017/0194299 | A1 | 7/2017 | Kwon |
| 2017/0345713 | A1 | 11/2017 | Chun et al. |
| 2019/0088547 | A1 | 3/2019 | Chiu |

FOREIGN PATENT DOCUMENTS

| | | | |
|---|---|---|---|
| CN | 102543902 | A | 7/2012 |
| CN | 102856239 | A | 1/2013 |
| CN | 104064479 | A | 9/2014 |
| CN | 107808860 | A | 3/2018 |
| CN | 108122784 | A | 6/2018 |
| KR | 20160051656 | A | 5/2016 |
| KR | 101922885 | B1 | 11/2018 |
| TW | 2006-20685 | A | 6/2006 |
| TW | 201539587 | A | 10/2015 |
| TW | 201545308 | A | 12/2015 |
| TW | 201628148 | A | 8/2016 |
| TW | 201830531 | A | 8/2018 |

PACKAGE-ON-PACKAGE (POP) TYPE SEMICONDUCTOR PACKAGES

CROSS-REFERENCE TO RELATED APPLICATION

This application is a continuation of U.S. patent application Ser. No. 16/874,722, filed May 15, 2020, which claims priority under 35 U.S.C. § 119 to Korean Patent Application No. 10-2019-0112368, filed on Sep. 10, 2019, in the Korean Intellectual Property Office, the disclosure of which is incorporated herein in its entirety by reference.

FIELD

The inventive concept relates to a semiconductor package, and more particularly, to a package-on-package (POP)-type semiconductor package.

BACKGROUND

Due to the rapid development of the electronics industry and user demand, electronic devices are becoming smaller and lighter, and thus, highly integrated semiconductor chips, which are among core components of electronic devices, become beneficial. In addition, as mobile products become widely used, small and multifunctional electronic devices become beneficial. Accordingly, a POP-type semiconductor package has been proposed in which an upper package having a different function from a lower package is stacked on the lower package.

SUMMARY

The inventive concept is directed to providing a package-on-package (POP) type semiconductor package, in which misalignment between a lower package and an upper package may be detected.

According to some embodiments of the inventive concept, there are provided package-on-package (POP) type semiconductor packages including: a lower package including a lower package substrate in which a lower semiconductor chip is, an upper redistribution structure on the lower package substrate and the lower semiconductor chip, and alignment marks, the lower package having a first size; and an upper package including an upper package substrate mounted on the upper redistribution structure of the lower package and electrically connected to the lower package and an upper semiconductor chip on the upper package substrate, the upper package having a second size smaller than the first size. The alignment marks may be used for identification of the upper package, and the alignment marks may be below and near outer boundaries of the upper package on the lower package. The alignment marks may indicate an outline of the upper package, and the alignment marks may be below and adjacent to the outline of the upper package.

According to some embodiments of the inventive concept, there are provided POP type semiconductor packages including: a lower package including a lower package substrate in which a lower semiconductor chip is, an upper redistribution structure on the lower package substrate and the lower semiconductor chip and including an upper redistribution insulating layer and an upper redistribution layer, and alignment marks, the lower package having a first size; and an upper package including an upper package substrate mounted on the upper redistribution structure of the lower package and electrically connected to the lower package and an upper semiconductor chip on the upper package substrate, the upper package having a second size smaller than the first size. The alignment marks may be used for identification of the upper package, and the alignment marks may be below and near outer boundaries of the upper package in the upper redistribution structure and may be at the same level as the upper redistribution layer. The alignment marks may indicate an outline of the upper package, and the alignment marks may be below and adjacent to the outline of the upper package.

According to some embodiments of the inventive concept, there are provided POP type semiconductor packages including: a lower package including a lower package substrate in which a lower semiconductor chip is, an upper redistribution structure on the lower package substrate and the lower semiconductor chip, and alignment marks, the lower package having a first size; an upper package including an upper package substrate mounted on the upper redistribution structure of the lower package and electrically connected to the lower package and an upper semiconductor chip on the upper package substrate, the upper package having a second size smaller than the first size; and a cover layer on the upper redistribution structure. The alignment marks may be used for identification of the upper layer, and the alignment marks may be below and near outer boundaries of the upper package on the upper redistribution structure and at the same level as the cover layer. The alignment marks may indicate an outline of the upper package, and the alignment marks may be below and adjacent to the outline of the upper package.

BRIEF DESCRIPTION OF THE DRAWINGS

Some embodiments of the inventive concept will be more clearly understood from the following detailed description taken in conjunction with the accompanying drawings in which.

DETAILED DESCRIPTION

Hereinafter, some example embodiments of the inventive concept will be described in detail with reference to the accompanying drawings.

Figure 1:
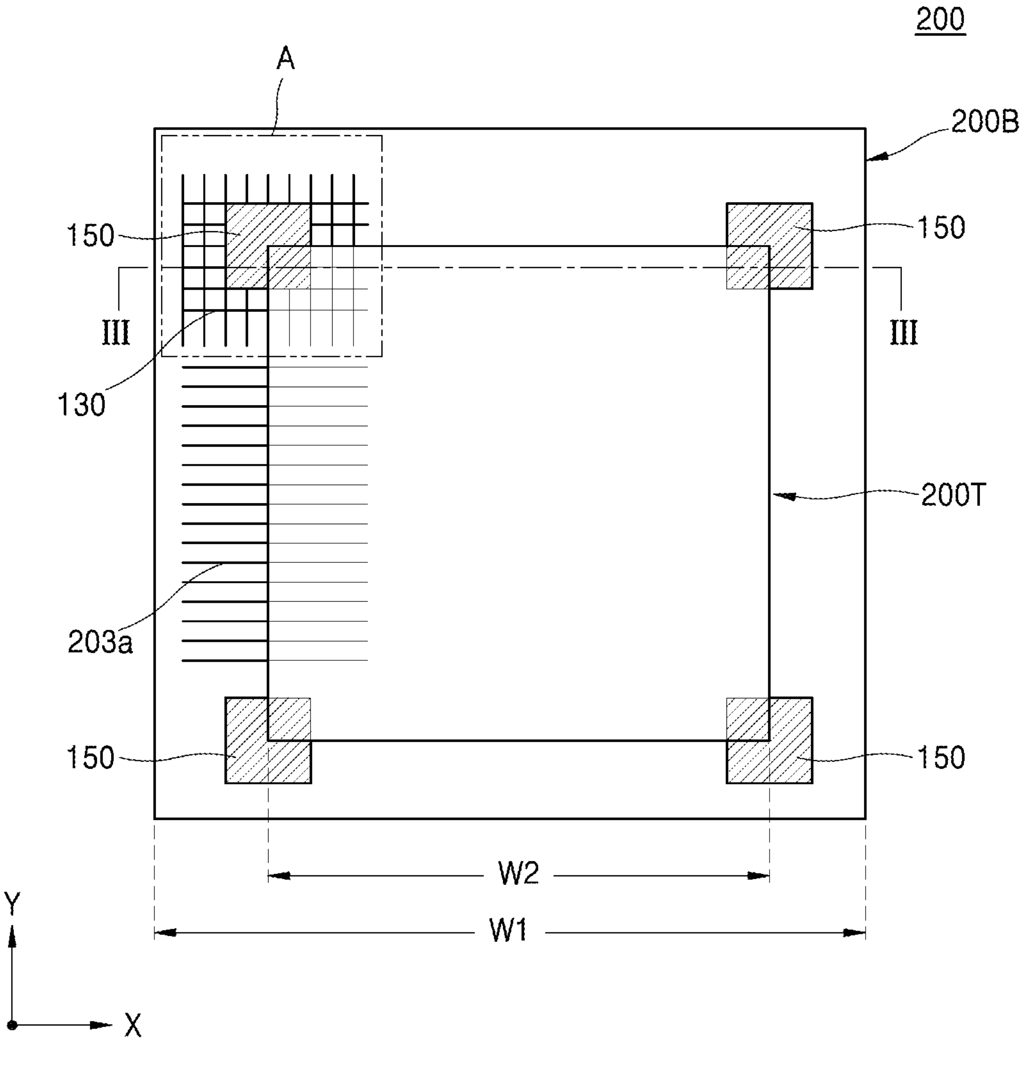
FIG. 1 is a schematic plan view of a package-on-package (POP)-type semiconductor package according to some embodiments of the inventive concept.
Figure 2:
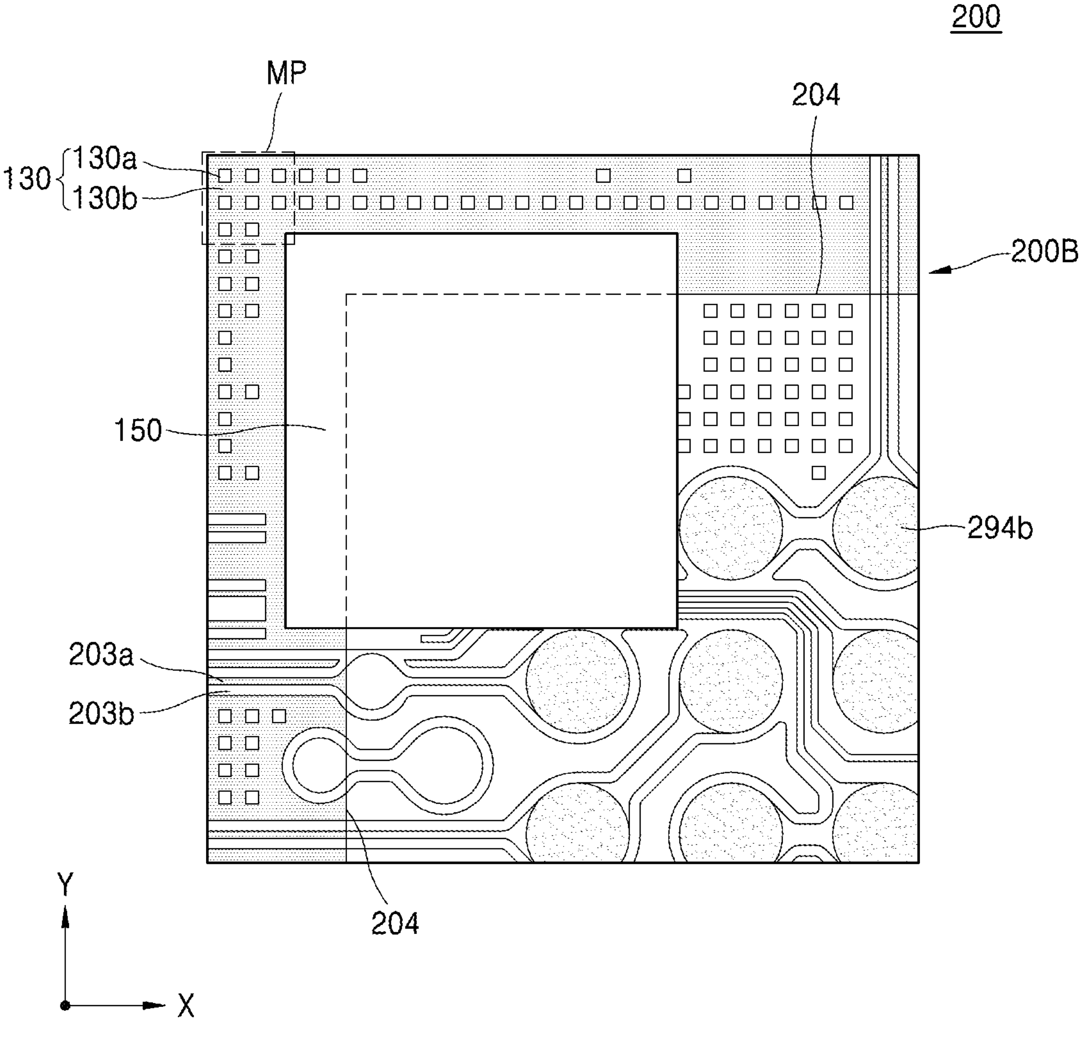
FIG. 2 is an enlarged view of a portion A of a lower package of FIG. 1.

The same elements may be assigned the same reference numerals in the drawings and may not be redundantly or repeatedly described herein. FIG. 1 is a schematic plan view of a package-on-package (POP) type semiconductor package according to some embodiments of the inventive concept. FIG. 2 is an enlarged view of a portion A of a lower package of FIG. 1. For simplicity of illustration, an upper package is not shown in FIG. 2.

Figure 3:
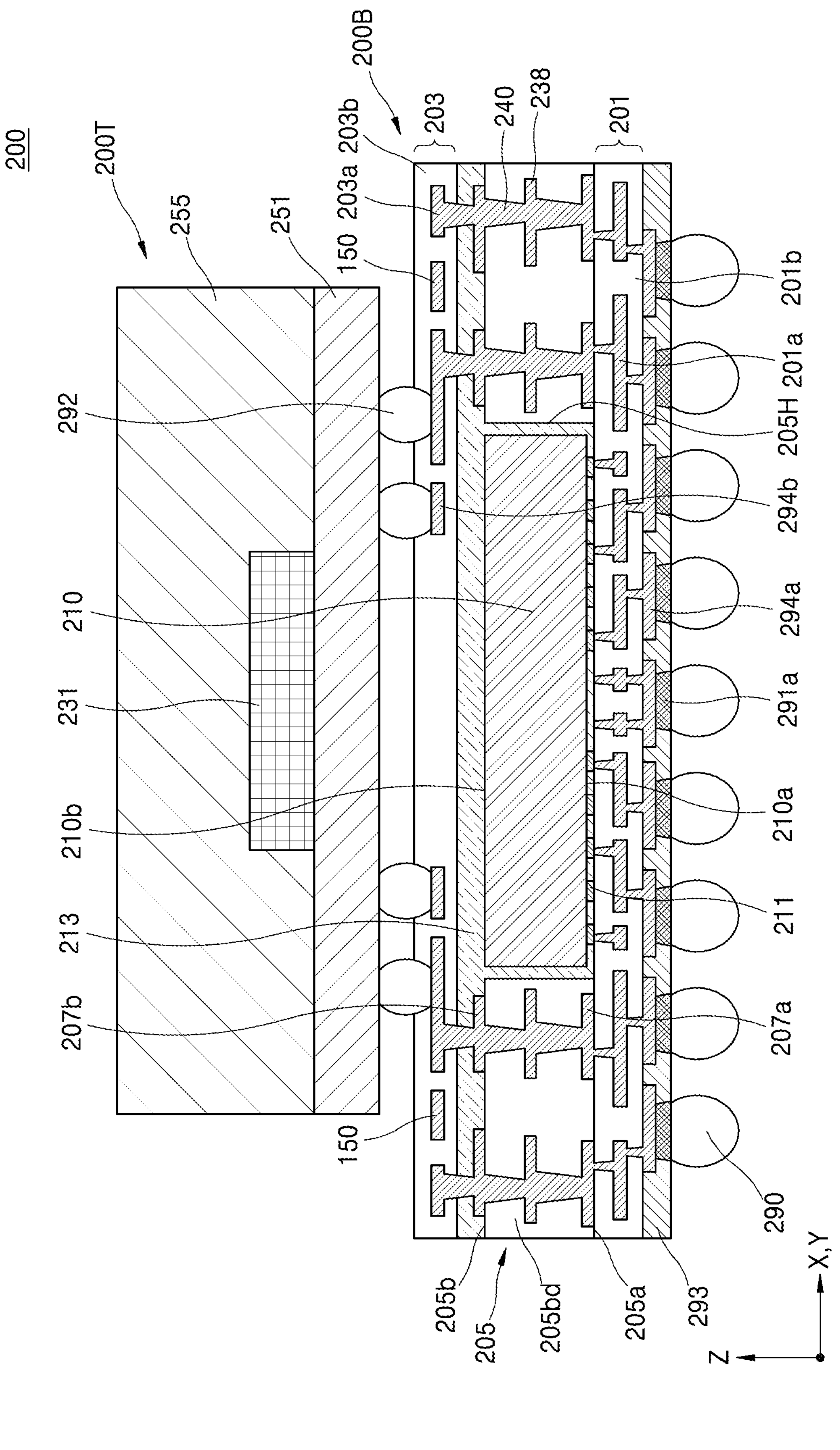
FIG. 3 is a cross-sectional view of the POP-type semiconductor package that may be taken along line III-III of FIG. 1.

In detail, FIGS. 1 and 2 illustrate an X-Y plane of a semiconductor package 200 parallel to one surface, e.g., a second surface 205*b*, of a lower package substrate 205 of FIG. 3.

For convenience of explanation, in FIGS. 1 and 2, portions of components which overlap each other are also illustrated. The semiconductor package 200 of FIGS. 1 and 2 may not show all components thereof, and only some of the components may be illustrated to explain the inventive concept. FIG. 2 is a top plan view of a lower package 200B. In FIG. 2, reference numeral 204 may refer to a boundary line at which an upper package 200T is mounted. The semiconductor package 200 includes the lower package 200B and the upper package 200T on the lower package 200B.

The lower package 200B may have a first size W1. The first size W1 may refer to a length or width. The upper package 200T may have a second size W2 smaller than the first size W1. The second size W2 may refer to a length or width. The first size W1 may be a size of a lower package substrate or a size of a lower redistribution structure described later. As illustrated in FIGS. 1 and 2, upper redistribution structures 203*a* and 203*b*, which include an upper redistribution insulating layer 203*b* and an upper redistribution layer 203*a*, may be provided on the lower package 200B.

In other words, the lower package 200B may include the upper redistribution structures 203*a* and 203*b*. Accordingly, the lower package 200B may be a fan out package which includes the upper redistribution structures 203*a* and 203*b* outside a lower semiconductor chip as described below In addition, the lower package 200B may be a panel level package or a wafer level package manufactured at a wafer level or a panel level. The lower package 200B may be collectively referred to as a fan out panel level package (FOPLP) or a fan out wafer level package (FOWLP). The upper redistribution layer 203*a* may be, for example, a metal layer.

Although FIG. 2 illustrates that the upper redistribution insulating layer 203*b* is provided only on a portion of the lower package 200B, in some embodiments, the upper redistribution insulating layer 203*b* may be provided on an entire surface of the lower package 200B. The upper redistribution insulating layer 203*b* may be, for example, a transparent organic layer. The upper redistribution insulating layer 203*b* may be, for example, a photo imageable dielectric (PID) layer. A mesh pattern (e.g., MP in FIG. 2 or a net pattern) 130 may be provided on the lower package 200B.

As illustrated in FIG. 2, the MP 130 may include a plurality of quadrangular insulating patterns 130*a* and a metal layer 130*b* between the plurality of insulating patterns 130*a*.

The MP 130 may suppress or inhibit lifting or twisting of the metal layer 130*b* by controlling thermal expansion of the metal layer 130*b* on the lower package 200B. A plurality of the MPs 130 may be provided on an upper region of the lower package 200B.

The MP 130 may be provided on a portion on which the upper package 200T is mounted or a portion on which the upper package 200T is not mounted. The metal layer 130*b* and the upper redistribution layer 203*a* of the MP 130 may be formed of the same material. An upper redistribution pad portion 294*b* which may be connected to the upper package 200T may be provided on the lower package 200B. The upper redistribution pad portion 294*b* may be positioned at the same level as the upper redistribution layer 203*a* as described below. The lower package 200B may include alignment marks 150. In some embodiments, the alignment marks 150 may be provided below and near outer boundaries of the upper package 200T on the lower package 200B.

Although FIG. 1 illustrates that the alignment marks 150 are provided below corner portions of the upper package 200T on the lower package 200B, the alignment marks 150 may be provided at boundaries between the lower package 200B and the upper package 200T on the lower package 200B. The alignment marks 150 may include upper portions of the lower package 200B that are not overlapped by the upper package 200T.

The alignment marks 150 may be provided to identify the upper package 200T with, for example, a vision camera when or after the upper package 200T is stacked (or mounted). The alignment marks 150 may be in the form of a solid pattern identifiable by the vision camera when the upper package 200T is mounted on the lower package 200B. In some embodiments, the alignment marks 150 may be used to identify or detect an outline of the upper package 200T to thereby detect misalignment of the upper package 200T. Accordingly, the alignment marks 150 may indicate the outline of the upper package 200T.

The solid pattern may refer to a non-empty pattern having a certain area. The alignment marks 150 may be referred to as alignment patterns for precisely aligning the upper package 200T on the lower package 200B. The alignment marks 150 may be identification patterns identifiable by a vision camera. The alignment marks 150 may be positioned on upper portions of the lower package 200B exposed by the upper package 200T. In some embodiments, each of the alignment marks 150 may include a portion not overlapped by the upper package 200T as illustrated in FIG. 1.

One of the alignment marks 150 may be positioned below one of the corner portions of the upper package 200T. When the upper package 200T has a quadrangular shape, at least two of the alignment marks 150 may be positioned below two opposite corner portions of the upper package 200T, respectively. In some embodiments, as illustrated in FIG. 1, four alignment marks 150 may be located below all of the quadrangular corner portions of the upper package 200T, respectively.

The alignment marks 150 may have various forms or shapes and may be quadrangles as illustrated in FIG. 1. As described herein, the semiconductor package 200 which is of POP type may include the alignment marks 150 formed on the lower package 200B not to be overlapped by the upper package 200T.

With the alignment marks 150, the boundary portions of the upper package 200T may be accurately measured or identified by the vision camera. Thus, in the POP type semiconductor package 200 of the inventive concept, misalignment between the lower package 200B and the upper package 200T may be detected by photographing the upper package 200T by using the alignment marks 150 for identification of the upper package 200T.

Accordingly, in the POP type semiconductor package 200 of the inventive concept, the upper package 200T may be precisely aligned on the lower package 200B.

FIG. 3 is a cross-sectional view of the POP type semiconductor package according to some embodiments of the inventive concept. FIG. 3 may be a cross-sectional view of the POP type semiconductor package taken along a line III-III of FIG. 1.

The semiconductor package 200 of FIG. 3 may not show all components thereof, and only some of the components may be illustrated to explain the inventive concept.

FIG. 3 is a cross-sectional view taken along a horizontal direction (e.g., an X direction or a Y direction) that is perpendicular to a Z-axis direction. The Z-axis direction may be perpendicular to an X-Y plane that is parallel to the second surface 205*b* of the lower package substrate 205. The semiconductor package 200 may include a lower package 200B and an upper package 200T.

The semiconductor package 200 may be a POP type package in which the upper package 200T is attached onto the lower package 200B. The upper package 200T may be attached onto the lower package 200B such that an active surface (e.g., a lower surface) of an upper semiconductor chip 231 faces the lower package 200B. The lower package 200B may be a fan out panel level package (FOPLP) or a fan out wafer level package (FOWLP).

The lower package 200B may be a fan out package which includes a lower redistribution structure 201 and an upper redistribution structure 203 at outer sides of a lower semiconductor chip 210. The lower package 200B may be a panel-level package or a wafer-level package which includes the lower package substrate 205. The lower package 200B may include the lower package substrate 205 and a lower semiconductor chip 210 in the lower package substrate 205. In some embodiments, the lower semiconductor chip 210 may be buried in the lower package substrate 205.

The lower package substrate 205 may be, for example, a printed circuit board. The lower package substrate 205 may be, for example, a semiconductor substrate. Here, an example in which the lower package substrate 205 is a printed circuit board will be described. A semiconductor substrate constituting the lower semiconductor chip 210 or the lower package substrate 205 may include, for example, silicon (Si).

The semiconductor substrate constituting the lower semiconductor chip 210 may include, for example, a semiconductor element such as germanium (Ge) or a compound semiconductor such as silicon carbide (SiC), gallium arsenide (GaAs), indium arsenide (InAs), and indium phosphide (InP). The semiconductor substrate constituting the lower semiconductor chip 210 may have, for example, a silicon-on-insulator (SOI) structure.

For example, the semiconductor substrate constituting the lower semiconductor chip 210 may include a buried oxide (BOX) layer. In some embodiments, the semiconductor substrate constituting the lower semiconductor chip 210 may include a conductive region, for example, a well including impurities. The impurities may be included in the well by a doping process. In some embodiments, the semiconductor substrate constituting the lower semiconductor chip 210 may include various types of isolation structures such as a shallow trench isolation (STI) structure. The lower semiconductor chip 210 may include an active surface 210*a* and an inactive surface 210*b* opposite to the active surface 210*a*.

In the lower semiconductor chip 210, various types of individual devices (not shown) may be provided on the active surface 210*a*. The various types of individual devices may include various types of microelectronics devices, e.g., metal-oxide-semiconductor field effect transistors (MOSFETs) such as a complementary metal-insulator-semiconductor (CMOS) transistor, system large-scale integration (LSI), an image sensor such as a CMOS imaging sensor (CIS), a micro-electro-mechanical system (MEMS), an active device, a passive device, and the like. The lower semiconductor chip 210 may include a chip pad 211 on the active surface 210*a*.

The chip pad 211 may be electrically connected to one or more of the individual devices of the lower semiconductor chip 210. The lower semiconductor chip 210 may include a central processing unit (CPU), a micro-processor unit (MPU), a graphic processing unit (GPU), or an application processor (AP). The lower semiconductor chip 210 may be a controller chip for control of the upper semiconductor chip 231 which will be described later. The lower package substrate 205 may be, for example, a multilayer printed circuit board on which a plurality of interconnection layers 238 are stacked.

The plurality of interconnection layers 238 may be electrically connected to each other. The lower package substrate 205 may include a lower package substrate body 205*bd*. The lower package substrate body 205*bd* may be formed of, for example, at least one material selected from among phenol resin, epoxy resin, and polyimide. For example, the lower package substrate body 205*bd* may include at least one material selected from among frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

A first connection pad 207*a* and a second connection pad 207*b* may be provided in the vicinity of a first surface 205*a* and the second surface 205*b* of the lower package substrate 205, respectively.

In the lower package substrate 205, the interconnection layers 238 connecting the first connection pad 207*a* and the second connection pad 207*b* and a conductive via 240 penetrating the lower package substrate body 205*bd* may be provided. In some embodiments, an interconnection pattern (or an interconnection layer) connecting the first connection pad 207*a*, the second connection pad 207*b*, and the conductive via 240 may be further provided on both surfaces of the lower package substrate body 205*bd*. The first connection pad 207*a*, the second connection pad 207*b*, and the interconnection layers 238 may be, for example, metal layers, respectively.

The first connection pad 207*a*, the second connection pad 207*b*, and the interconnection layers 238 may be formed of, for example, electrolytically deposited (ED) copper foil, rolled-annealed (RA) copper foil, stainless steel foil, aluminum foil, ultra-thin copper foils, sputtered copper, copper alloys, or the like. The conductive via 240 may be formed of, for example, copper, nickel, stainless steel, or beryllium copper. The lower package substrate 205 may include a cavity 205H penetrating the lower package substrate body 205*bd*. In some embodiments, the cavity 205H may extend through the lower package substrate body 205*bd*.

The lower semiconductor chip 210 may be in the cavity 205H of the lower package substrate 205. A horizontal cross-sectional area of the cavity 205H may be larger than that of the lower semiconductor chip 210. A depth of the cavity 205H, i.e., a thickness of the lower package substrate 205 in the Z direction, may be equal to or greater than a thickness of the lower semiconductor chip 210 in the Z direction. The lower semiconductor chip 210 may be in the cavity 205H to be spaced apart from an inner side surface of the cavity 205H of the lower package substrate 205. In some embodiments, the lower semiconductor chip 210 may be spaced apart from side surfaces of the lower package substrate 205, which define the cavity 205H.

Accordingly, a lower molding layer 213 may be provided on the lower semiconductor chip 210 and the lower package substrate 205 to surround the lower semiconductor chip 210 in the cavity 205H. The lower molding layer 213 may be provided on the second surface 205*b* of the lower package substrate 205. The second connection pad 207*b* may be covered with the lower molding layer 213. The chip pad 211 of the lower semiconductor chip 210 and the first connection pad 207*a* of the lower package substrate 205 may be at substantially the same level. In some embodiments, a surface of the chip pad 211 and a surface of the first connection pad 207*a* that are adjacent to the first surface 205*a* of the lower package substrate 205 may be coplanar with each other as illustrated in FIG. 3. In some embodiments, the surface of the chip pad 211 and the surface of the first connection pad 207*a* that are adjacent to the first surface 205*a* of the lower package substrate 205 may be coplanar with the first surface 205*a* of the lower package substrate 205 as illustrated in FIG. 3. "An element A covers an element B" (or similar language) as used herein means that the element A extends on the element B but does not necessarily mean that the element A covers the surface of the element B entirely.

The lower redistribution structure 201 may be provided on the active surface 210*a* of the lower semiconductor chip 210 and the first surface 205*a* of the lower package substrate 205. The lower redistribution structure 201 may include a plurality of layers. The lower redistribution structure 201 may include a lower redistribution layer 201*a* and a lower redistribution insulating layer 201*b*.

The lower redistribution layer 201*a* may be a multilayer structure in which a plurality of redistribution patterns or interconnection layers are stacked. The lower redistribution insulating layer 201*b* may be a multilayer structure in which a plurality of insulating layers are stacked. In some embodiments, the lower redistribution layer 201*a* may be a metal layer formed of, for example, a material such as a copper, nickel, stainless steel, or beryllium copper. A first cover layer 293 may be provided below the lower redistribution structure 201.

The first cover layer 293 may be provided to protect the lower redistribution structure 201. The first cover layer 293 may expose a portion of the lower redistribution pad portion 294*a* connected to the lower redistribution layer 201*a*. A first external connection pad 291*a* may be provided on the portion of the lower redistribution pad portion 294*a* exposed by the first cover layer 293.

The first external connection pad 291*a* may be finely formed due to the formation of the first cover layer 293. The first cover layer 293 may be formed of, for example, a hydrocarbon cyclic compound containing a filler. The filler may be, for example, a $SiO_2$ filler. The first cover layer 293 may be, for example, Ajinomoto build-up film (ABF). The first cover layer 293 may be thicker than the lower redistribution pad portion 294*a* and the first external connection pad 291*a*. External connection terminals 290 may be attached onto the first external connection pads 291*a*, respectively.

The external connection terminals 290 may be, for example, solder balls or bumps. The external connection terminals 290 may electrically connect the semiconductor package 200 to an external device. The upper redistribution structure 203 may be positioned on the lower package substrate 205 and the lower semiconductor chip 210.

The upper redistribution structure 203 may include a plurality of layers. The upper redistribution structure 203 may include the upper redistribution layer 203*a* and the upper redistribution insulating layer 203*b*. The upper redistribution layer 203*a* may be interconnection patterns horizontally connected to each other. The upper redistribution layer 203*a* may pass through the lower molding layer 213 and may be connected to the second connection pad 207*b*. The upper redistribution layer 203*a* may be a metal layer formed of, for example, a material such as a copper, nickel, stainless steel, or beryllium copper.

The upper redistribution insulating layer 203*b* may be, for example, a transparent organic layer. The upper redistribution insulating layer 203*b* may be, for example, a photo imageable dielectric (PID) layer. The upper redistribution insulating layer 203*b* may include, for example, epoxy or polyimide. In some embodiments, the upper redistribution insulating layer 203*b* may be formed by applying and curing a redistribution material. The alignment marks 150 may be included in the upper redistribution insulating layer 203*b* constituting the upper redistribution structure 203.

The alignment marks 150 may be positioned at the same level as the upper redistribution layer 203*a*. The alignment marks 150 may be located below and near the outer boundary of the upper package 200T. The alignment marks 150 may be provided to accurately identify or detect the outline of the upper package 200T with a vision camera when or after the upper package 200T is stacked. In some embodiments, the alignment marks 150 may be formed of the same material as the upper redistribution layer 203*a*. Each of the alignment marks 150 and the upper redistribution layer 203*a* may include a lower surface facing the lower package substrate 205 and an upper surface opposite the lower surface. In some embodiments, the upper surfaces of the alignment marks 150 may be coplanar with the upper surface of the upper redistribution layer 203*a* as illustrated in FIG. 3.

The alignment marks 150 may be manufactured by the same manufacturing process as the upper redistribution layer 203*a*. The alignment marks 150 may be positioned on an upper portion of the lower package 200B exposed by (i.e., not overlapped by) the upper package 200T and below the corner portions of the upper package 200T, respectively. Accordingly, when the upper package 200T is mounted on the lower package 200B, the alignment marks 150 may be used as identification patterns for identification of the outline of the upper package 200T with, for example, a vision camera.

The alignment marks 150 have been described herein with reference to FIGS. 1 and 2 and thus a detailed description thereof will be omitted here. In the semiconductor package 200, the alignment marks 150 may be used to accurately identify or detect the outline of the upper package 200T by photographing the upper package 200T by the vision camera.

Accordingly, in the semiconductor package 200, misalignment between the lower package 200B and the upper package 200T may be detected. As a result, in the POP type semiconductor package 200 of the inventive concept, the upper package 200T may be precisely aligned on the lower package 200B. In the semiconductor package 200 according to some embodiments of the inventive concept, when the upper package 200T is accurately aligned on the lower package 200B, package connection terminals 292 may be directly connected to the upper redistribution pad portion 294*b* of the upper redistribution structure 203.

The upper redistribution pad portion 294*b* may be provided on a portion of the upper redistribution layer 203*a*. The package connection terminals 292 may be, for example, solder balls or bumps.

The package connection terminals 292 may electrically connect the lower package 200B to the upper package 200T. The upper package 200T may be attached onto the lower package 200B with the package connection terminals 292 therebetween. The upper package 200T may include the upper semiconductor chip 231 attached onto an upper package substrate 251.

The upper package substrate 251 and the upper semiconductor chip 231 may be electrically connected to each other by bonding wire or bumps. In FIG. 3, the upper semiconductor chip 231 may be connected to the upper package substrate 251 by using bumps (not shown). The upper semiconductor chip 231 may be, for example, a memory semiconductor chip.

The memory semiconductor chip may be, for example, a volatile memory semiconductor chip, such as dynamic random access memory (DRAM) or static random access memory (SRAM), or a nonvolatile memory semiconductor chip, such as phase-change random access memory (PRAM), magnetoresistive random access memory (MRAM), ferroelectric random access memory (FeRAM) or resistive random access memory (RRAM). The upper semiconductor chip 231 may be any semiconductor chip and is not limited to examples listed herein.

For example, the upper semiconductor chip 231 may include a plurality of memory semiconductor chips. In some embodiments, the upper package 200T may further include a controller chip for controlling the upper semiconductor chip 231. The upper package 200T may include an upper molding layer 255 surrounding at least a portion of the upper semiconductor chip 231. In some embodiments, the upper molding layer 255 may completely enclose the upper semiconductor chip 231 but the inventive concept is not limited thereto. In some embodiments, the upper molding layer 255 may extend on only a portion of the upper semiconductor chip 231.

The upper molding layer 255 may be formed of, for example, an epoxy molding compound (EMC). The upper molding layer 255 is illustrated as covering the inactive surface (e.g., the upper surface) of the upper semiconductor chip 231 but is not limited thereto. As described herein, the semiconductor package 200 may be of a POP type, in which the upper package 200T is attached onto the lower package 200B to be electrically connected to the lower package 200B via the package connection terminals 292.

In addition, in the POP type semiconductor package 200 of the inventive concept, misalignment between the lower package 200B and the upper package 200T may be detected using the alignment marks 150 for identification of the upper package 200T by photographing the upper package 200T by a vision camera.

Accordingly, in the POP type semiconductor package 200 of the inventive concept, the upper package 200T may be precisely aligned on the lower package 200B.

Figure 4:
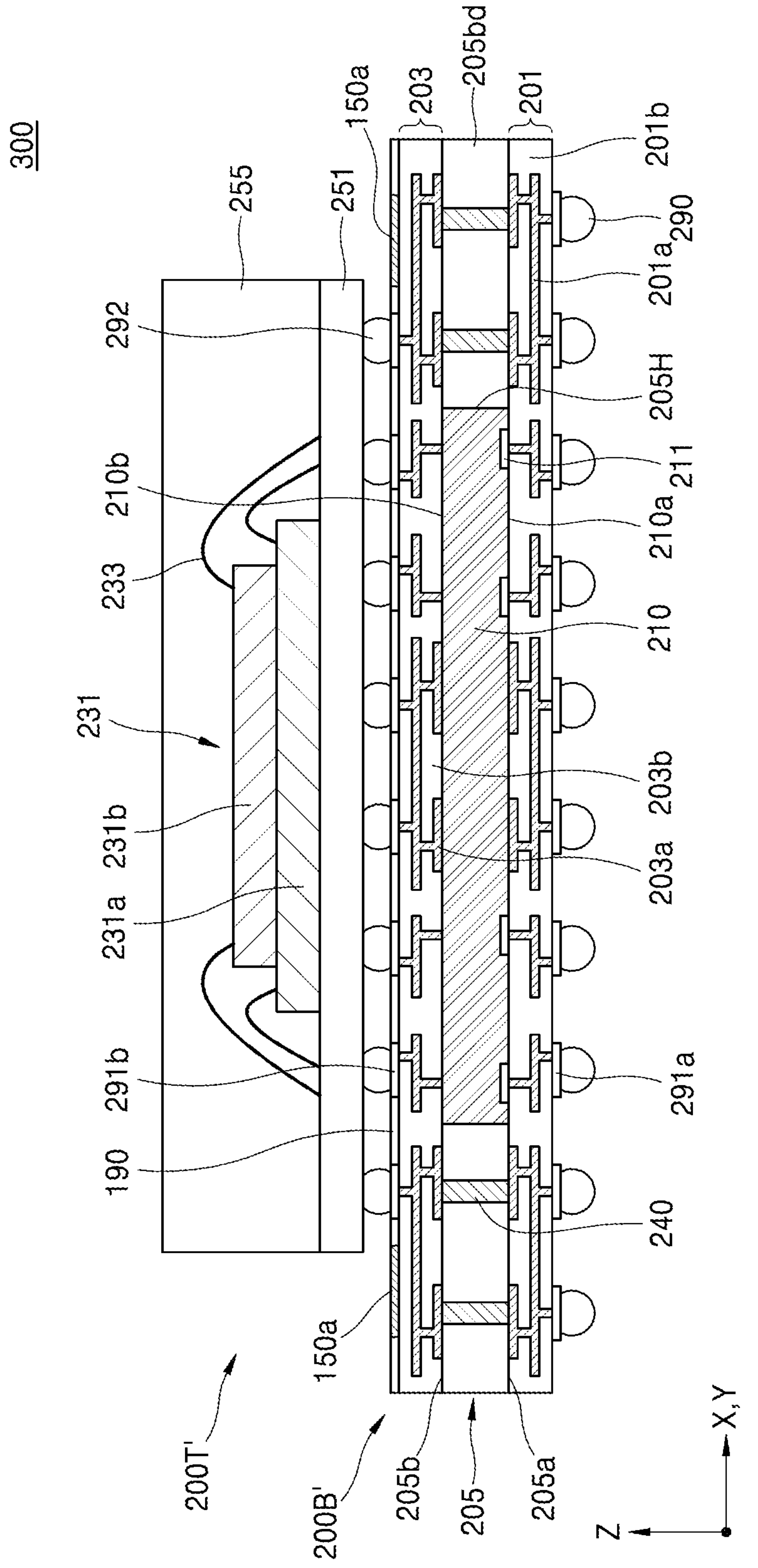
FIG. 4 is a schematic cross-sectional view of a POP-type semiconductor package according to some embodiments of the inventive concept.

FIG. 4 is a schematic cross-sectional view of a POP type semiconductor package according to some embodiments of the inventive concept.

A semiconductor package 300 of FIG. 4 is similar to the semiconductor package 200 of FIGS. 1 to 3 but a second cover layer 190 is further provided on an upper redistribution structure 203, and alignment marks 150*a* are provided at the same level as the cover layer 190.

Portions of FIG. 4 that are similar to or the same as those of FIGS. 1 to 3 may be briefly described or may not be described.

The semiconductor package 300 of FIG. 4 may not show all components thereof, and only some of the components may be illustrated to explain the inventive concept. The semiconductor package 300 may be a POP type package in which an upper package 200T' is attached onto a lower package 200B'.

The lower package 200B' may be a fan out panel level package (FOPLP) or a fan out wafer level package (FOWLP). The lower package 200B' may include a lower semiconductor chip 210 in (e.g., buried in) a lower package substrate 205.

The lower package substrate 205 may be, for example, a printed circuit board. The lower package substrate 205 may be, for example, a semiconductor substrate. Here, an example in which the lower package substrate 205 is a printed circuit board will be described. The lower semiconductor chip 210 may include an active surface 210*a* and an inactive surface 210*b* opposite to the active surface 210*a*.

The lower semiconductor chip 210 may include a chip pad 211 on the active surface 210*a*. The chip pad 211 may be electrically connected to one or more of individual devices included in the lower semiconductor chip 210. The lower package substrate 205 may include a lower package substrate body 205*bd*.

The lower package substrate body 205*bd* may be formed of, for example, at least one material selected from among phenol resin, epoxy resin, and polyimide. A conductive via 240 penetrating the lower package substrate body 205*bd* may be formed in the lower package substrate 205.

The conductive via 240 may be a metal layer formed of, for example, copper, nickel, stainless steel, or beryllium copper. The lower package substrate 205 may include a cavity 205H penetrating or extending through the lower package substrate body 205*bd*.

The lower semiconductor chip 210 may be provided in the cavity 205H of the lower package substrate 205. Unlike in FIG. 3, the lower semiconductor chip 210 may be in contact with an inner side surface of the cavity 205H. In some embodiments, the lower semiconductor chip 210 may directly contact side surfaces of the lower package substrate body 205*bd*, which define the cavity 205H as illustrated in FIG. 4. The lower redistribution structure 201 may be provided on the active surface 210*a* of the lower semiconductor chip 210 and the first surface 205*a* of the lower package substrate 205.

The lower redistribution structure 201 may include a lower redistribution layer 201*a* and a lower redistribution insulating layer 201*b*. The lower redistribution layer 201*a* may include redistribution patterns. Unlike in FIG. 3, a first external connection pad 291*a* may be formed directly below the lower redistribution structure 201 without an intervening first cover layer (e.g., the first cover layer 293 in FIG. 3).

The first external connection pad 291*a* may be connected to the lower redistribution layer 201*a*. External connection terminals 290 may be attached onto the first external connection pad 291*a*. An upper redistribution structure 203 may be positioned on the lower package substrate 205 and the lower semiconductor chip 210.

The upper redistribution structure 203 includes an upper redistribution layer 203*a* and an upper redistribution insulating layer 203*b*. The upper redistribution layer 203*a* may include redistribution patterns. A second cover layer 190 and a second external connection pad 291*b* may be provided on the upper redistribution structure 203.

The second external connection pad 291*b* may be electrically connected to the upper redistribution layer 203*a*. When the second cover layer 190 is provided, the second external connection pad 291*b* may be formed more precisely. In some embodiments, the second cover layer 190 may be formed of the same material as the upper redistribution insulating layer 203*b*.

For example, the second cover layer 190 may be a transparent organic layer. The second cover layer 190 may be, for example, a photo imageable dielectric (PID) layer. Alignment marks 150*a* may be formed on the upper redistribution structure 203 at the same level as the second cover layer 190. In some embodiments, a surface of each of the alignment marks 150*a* and a surface of the upper redistribution structure 203 may be coplanar with each other as illustrated in FIG. 4.

The alignment marks 150*a* may be positioned at the same level as the second cover layer 190 and below and near outer boundaries of the upper package 200T' on the upper redistribution structure 203. The alignment marks 150*a* may perform the same function as the alignment marks 150 of FIGS. 1 to 3.

That is, the alignment marks 150*a* may be provide for identification of the outline of the upper package 200T' when or after the upper package 200T' is stacked on the lower package 200B'. In some embodiments, the alignment marks 150*a* may be formed of the same material, e.g., a metal layer, as the upper redistribution layer 203*a*. The alignment marks 150*a* may be positioned on an upper portion of the lower package 200B' exposed by the upper package 200T' and below the corner portions of the upper package 200T'. In some embodiments, one of the corner portions of the upper package 200T' may overlap a first portion of one of the alignment marks 150*a*, and the one of the corner portions of the upper package 200T' may not overlap a second portion of the one of the alignment marks 150*a* as illustrated in FIG. 4. As used herein, "an element A overlapping an element B" (or similar language) means that there is at least one line extending in the Z-axis direction that intersects both the element A and the element B.

The alignment marks 150 have been described with reference to FIGS. 1 to 3 and thus a detailed description thereof will be omitted here. In the semiconductor package 300, misalignment between the lower package 200B' and the upper package 200T' may be detected by photographing the upper package 200T' by using the alignment marks 150*a* for identification of the upper package 200T'.

When no misalignment occurs between the lower package 200B' and the upper package 200T', the package connection terminal 292 may be directly connected to the second external connection pad 291*b* of the upper redistribution structure 203. The upper package 200T' may be mounted on the package connection terminal 292.

The upper package 200T' may be attached onto the lower package 200B' with the package connection terminal 292 therebetween. The upper package 200T' may include the upper semiconductor chip 231 attached onto an upper package substrate 251. The upper semiconductor chip 231 may include a first upper semiconductor chip 231*a* and a second upper semiconductor chip 231*b*.

The first upper semiconductor chip 231*a* and the second upper semiconductor chip 231*b* may be connected to the upper package substrate 251 by bonding wires 233. The upper semiconductor chip 231 may include a memory chip and/or a controller chip. The upper package 200T' may include an upper molding layer 255 surrounding at least a portion of the upper semiconductor chip 231. As used herein the term "and/or" includes any and all combinations of one or more of the associated listed items.

The upper molding layer 255 may be formed of, for example, an epoxy molding compound (EMC). The upper molding layer 255 is illustrated as covering an inactive surface (e.g., an upper surface) of the upper semiconductor chip 231 but the inventive concept is not limited thereto. In some embodiments, the upper molding layer 255 may not cover an inactive surface (e.g., an upper surface) of the upper semiconductor chip 231. As described herein, the semiconductor package 300 may be of a POP type, in which the upper package 200T' is attached onto the lower package 200B' to be electrically connected to the lower package 200B' via the package connection terminal 292.

In addition, in the POP type semiconductor package 300 of the inventive concept, misalignment between the lower package 200B' and the upper package 200T' may be detected using the alignment marks 150*a*.

Figure 5:
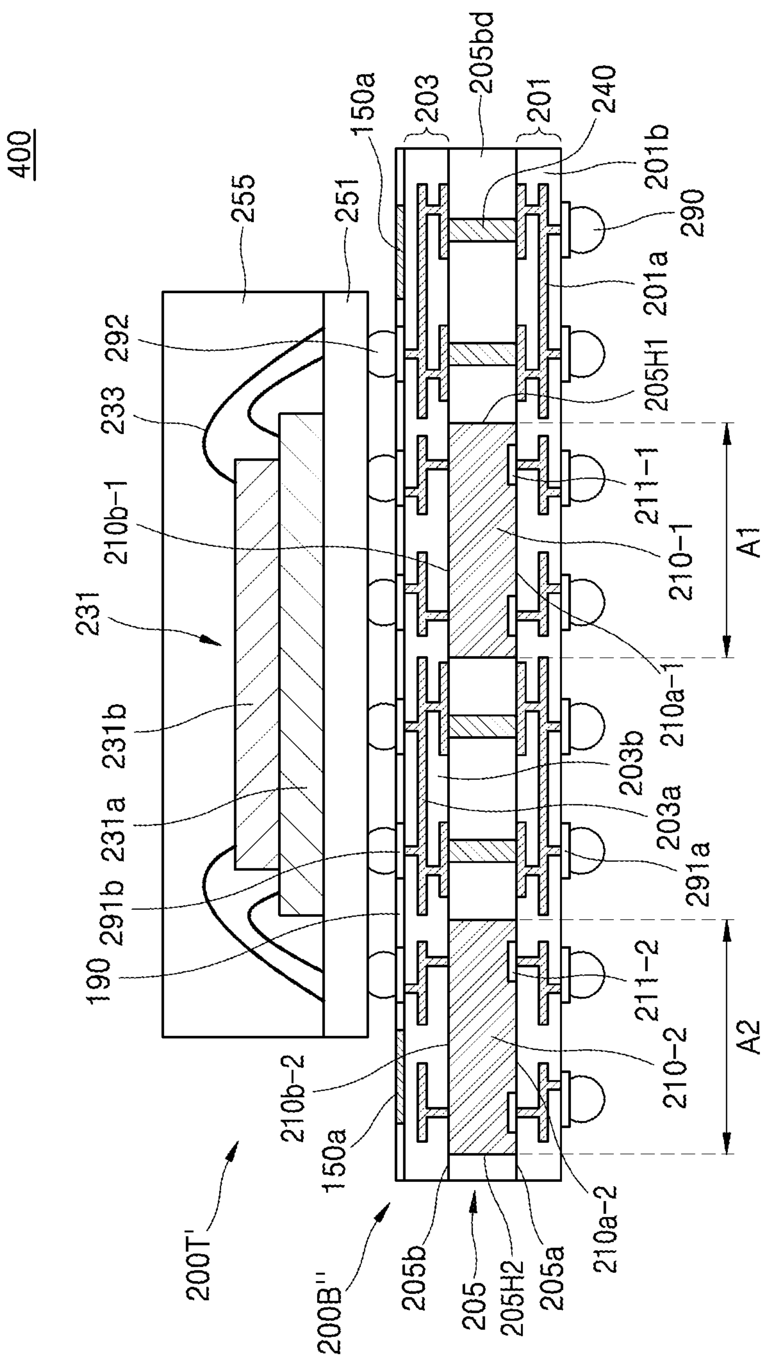
FIG. 5 is a schematic cross-sectional view of a POP-type semiconductor package according to some embodiments of the inventive concept.

FIG. 5 is a schematic cross-sectional view of a POP type semiconductor package according to some embodiments of the inventive concept.

A semiconductor package 400 of FIG. 5 may be similar to the semiconductor package 300 of FIG. 4 but a plurality of first and second lower semiconductor chips 210-1 and 210-2 are in (e.g., buried in) a lower package substrate 205.

Portions of FIG. 5 that are similar to or the same as those of FIGS. 1 to 3 and 4 may be briefly described or may not be described. The semiconductor package 400 may be a POP type package in which an upper package 200T" is attached onto a lower package 200B".

The lower package 200W may include a first lower semiconductor chip 210-1 and a second lower semiconductor chip 210-2 which are in (e.g., buried in) the lower package substrate 205 to be spaced apart from each other. The lower package substrate 205 may be, for example, a printed circuit board. The first lower semiconductor chip 210-1 and the second lower semiconductor chip 210-2 may be respectively positioned in a first region A1 and a second region A2 of the lower package substrate 205.

The first lower semiconductor chip 210-1 may include an active surface 210*a*-1 and an inactive surface 210*b*-1 opposite to the active surface 210*a*-1. The lower semiconductor chip 210-1 may include a chip pad 211-1 on the active surface 210*a*-1. The second lower semiconductor chip 210-2 may include an active surface 210*a*-2 and an inactive surface 210*b*-2 opposite to the active surface 210*a*-2.

The second lower semiconductor chip 210-1 may include a chip pad 211-2 on the active surface 210*a*-2. A conductive via 240 penetrating a lower package substrate body 205*bd* may be provided in the lower package substrate 205.

The conductive via 240 may be provided between the first lower semiconductor chip 210-1 and the second lower semiconductor chip 210-2. The lower package substrate 205 may include a first cavity 205H1 and a second cavity 205H2 which may penetrate or extend through the lower package substrate body 205bd. The first lower semiconductor chip 210-1 may be provided in the first cavity 205H1 of the lower package substrate 205. The second lower semiconductor chip 210-2 may be provided in the second cavity 205H2 of the lower package substrate 205. The first lower semiconductor chip 210-1 and the second lower semiconductor chip 210-2 may respectively contact an inner surface of the first cavity 205H1 and an inner surface of the second cavity 205H2. In some embodiments, the first lower semiconductor chip 210-1 may directly contact side surfaces of the lower package substrate body 205bd, which define the first cavity 205H1, and the second lower semiconductor chip 210-2 may directly contact side surfaces of the lower package substrate body 205bd, which define the second cavity 205H2, as illustrated in FIG. 5.

A lower redistribution structure 201 may be provided on the active surface 210a-1 of the first lower semiconductor chip 210-1, the active surface 210a-2 of the second lower semiconductor chip 210-2, and a first surface 205a of the lower package substrate 205. The lower redistribution structure 201 may include a lower redistribution layer 201a and a lower redistribution insulating layer 201b.

A first external connection pad 291a and an external connection terminal 290 may be attached to a lower portion of the lower redistribution structure 201. An upper redistribution structure 203 may be positioned on the lower package substrate 205 and the first and the second lower semiconductor chips 210-1 and 210-2.

The upper redistribution structure 203 may include an upper redistribution layer 203a and an upper redistribution insulating layer 203b. A second cover layer 190 and a second external connection pad 291b may be provided on the upper redistribution structure 203. Alignment marks 150a may be formed on the upper redistribution structure 203 at the same level as the second cover layer 190. The alignment marks 150a may be positioned at the same level as the second cover layer 190 and below and near outer boundaries of the upper package 200T' on the upper redistribution structure 203.

The alignment marks 150a may perform the same function as the alignment marks 150 and 150a of FIGS. 1 to 4. The alignment marks 150 and 105a have been described herein with reference to FIGS. 1 to 4 and thus a detailed description thereof will be omitted here. A package connection terminal 292 may be directly connected to the second external connection pad 291b of the upper redistribution structure 203. The upper package 200T' may be mounted on the package connection terminal 292. As described herein, the semiconductor package 400 of the inventive concept may include a first lower semiconductor chip 210-1 and a second lower semiconductor chip 210-2.

Each of the first and second lower semiconductor chips 210-1 and 210-2 may include, for example, a central processing unit (CPU), a micro-processor unit (MPU), a graphic processing unit (GPU), or an application processor (AP). The second lower semiconductor chip 210-2 may be, for example, a power management chip.

In some embodiments, the first lower semiconductor chip 210-1 or the second lower semiconductor chip 210-2 may be a controller chip for controlling an upper semiconductor chip 231. As described herein, when a plurality of lower semiconductor chips are included in the lower package substrate 205, various functions may be performed in the semiconductor package 400. In addition, in the semiconductor package 400 of the inventive concept, misalignment between the lower package 200B" and the upper package 200T' may be detected using the alignment marks 150a.

Accordingly, in the semiconductor package 400, the upper package 200T' may be precisely aligned on the lower package 200B".

FIGS. 6 to 9 are schematic plan views of POP type semiconductor packages according to some embodiments of the inventive concept.

Semiconductor packages 200-1, 200-2, 200-3, and 200-4 of FIGS. 6 to 9 may be similar to the semiconductor package 200 of FIGS. 1 to 3 but an arrangement of aligned marks 150-1, 150-2, 150-3, and 150-4 may be different.

The arrangement of the alignment marks 150-1, 150-2, 150-3, and 150-4 of FIGS. 6 to 9 are applicable to the arrangement of the alignment marks 150a of FIGS. 4 and 5.

Portions of FIGS. 6 to 9 that are similar to or the same as those of FIGS. 1 to 3 may be briefly described or may not be described. The semiconductor packages 200-1, 200-2, 200-3, and 200-4 each include a lower package 200B and an upper package 200T on the lower package 200B.

The semiconductor packages 200-1, 200-2, 200-3, and 200-4 may each include a mesh pattern 130 and an upper redistribution layer 203a. In the semiconductor packages 200-1, 200-2, 200-3, and 200-4, the alignment marks 150-1, 150-2, 150-3, and 150-4 are positioned below and near outer boundaries of the upper package 200T on the lower package 200B.

Figure 6:
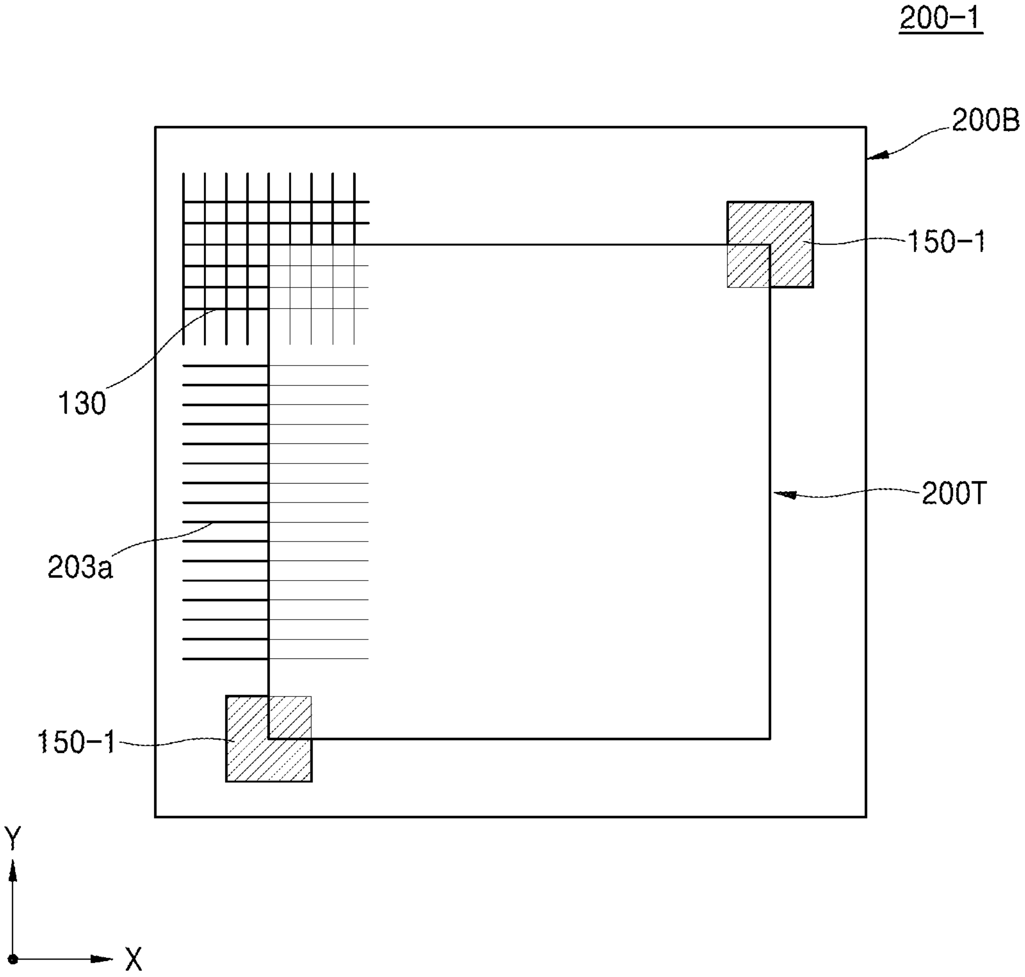
FIGS. 6 to 9 are schematic plan views of POP-type semiconductor packages according to some embodiments of the inventive concept.

The alignment marks 150-1, 150-2, 150-3, and 150-4 may be formed in, for example, a quadrangular shape. In some embodiments, in the semiconductor package 200-1 of FIG. 6, two opposite alignment marks 150-1 may be provided at lower left and upper right corners among the corners of the upper package 200T on the lower package 200B. In some embodiments, two alignment marks 150-1 may be on the lower package 200B and adjacent opposite corners of the upper package 200T, as illustrated in FIG. 6.

Figure 7:
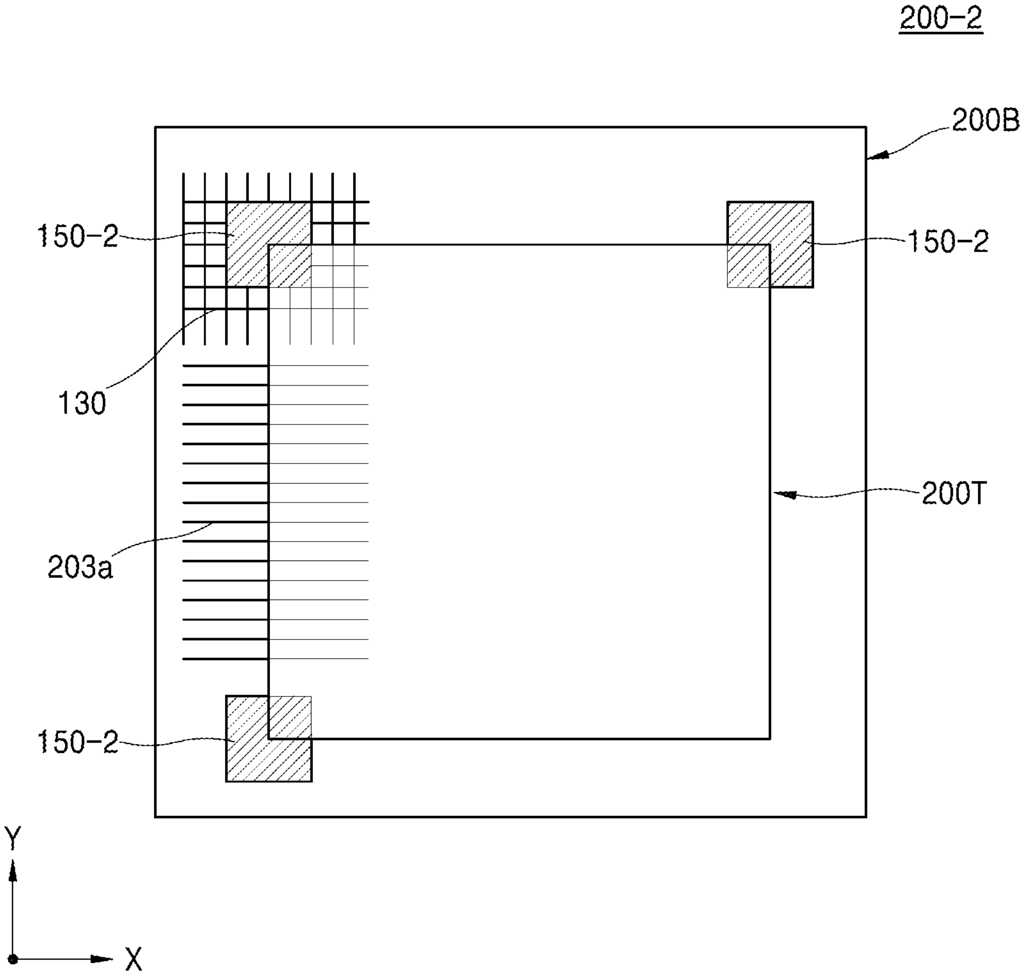

In some embodiments, in the semiconductor package 200-2 of FIG. 7, three alignment marks 150-2 may be provided at upper left, lower left and upper right corners among the corners of the upper package 200T on the lower package 200B.

Figure 8:
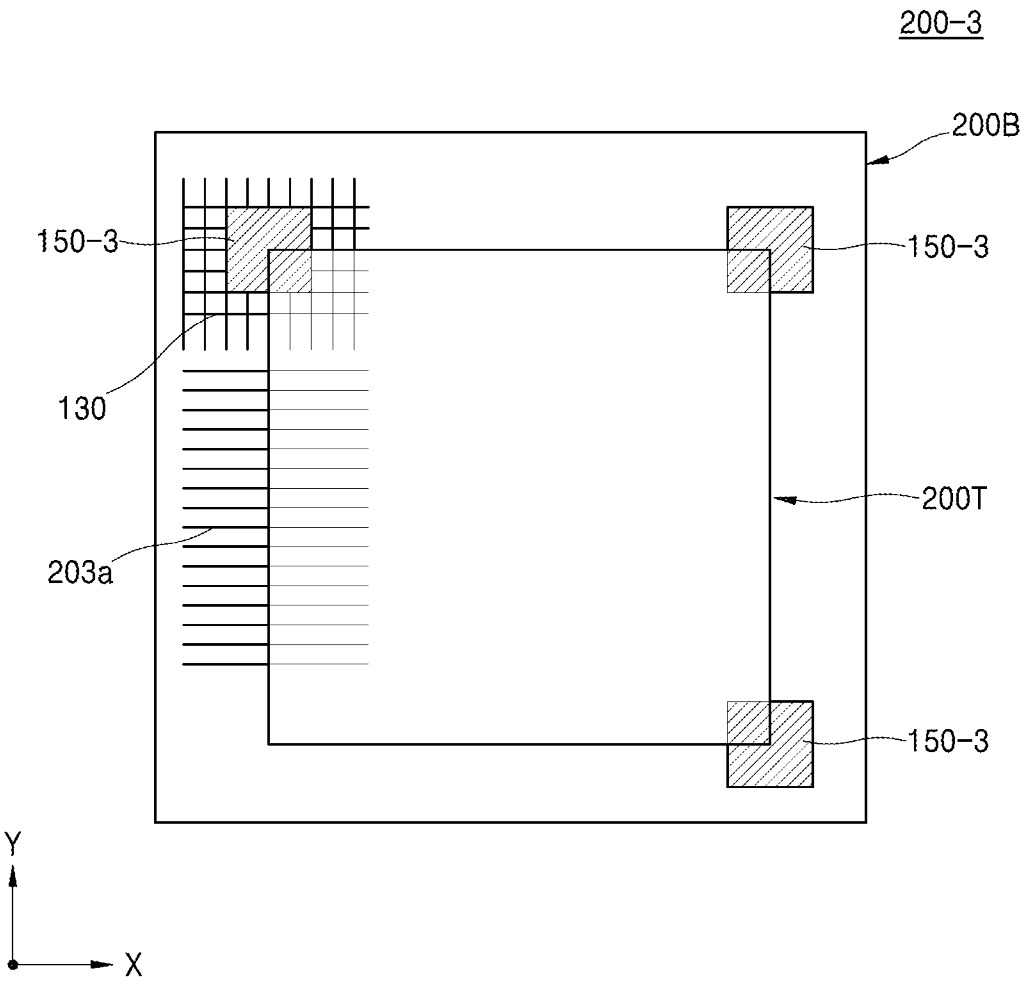

In some embodiments, in the semiconductor package 200-3 of FIG. 8, three alignment marks 150-3 may be provided at upper left, lower right and upper right corners among the corners of the upper package 200T on the lower package 200B.

Figure 9:
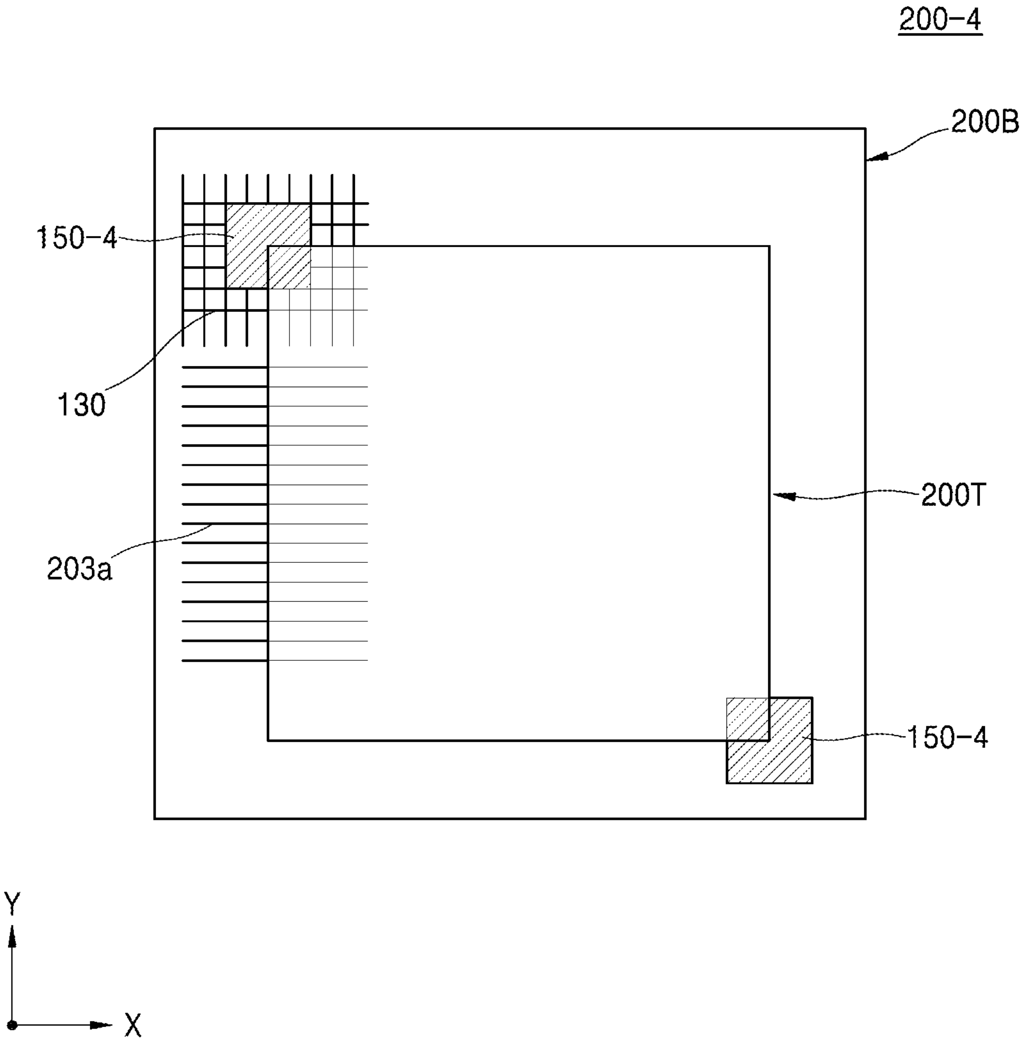

In some embodiments, in the semiconductor package 200-5 of FIG. 9, two alignment marks 150-4 may be provided at upper left and lower right corners among the corners of the upper package 200T on the lower package 200B.

As described herein, in the semiconductor packages 200-1, 200-2, 200-3, and 200-4, when the upper package 200T has a quadrangular shape, the alignment marks 150-1, 150-2, 150-3, and 150-4 may be located below at least two opposite corner portions among the quadrangular corner portions of the upper package 200T.

Figure 10:
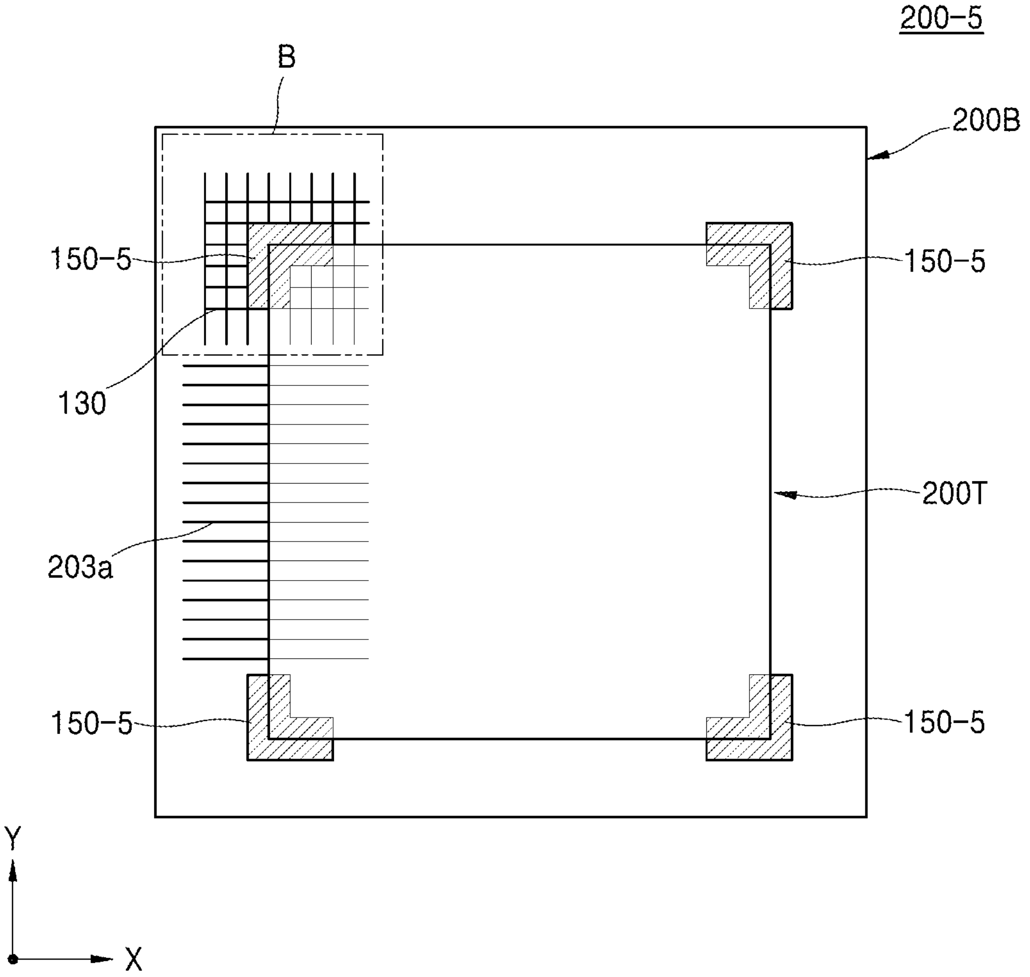
FIG. 10 is a schematic plan view of a POP-type semiconductor package according to some embodiments of the inventive concept.
Figure 11:
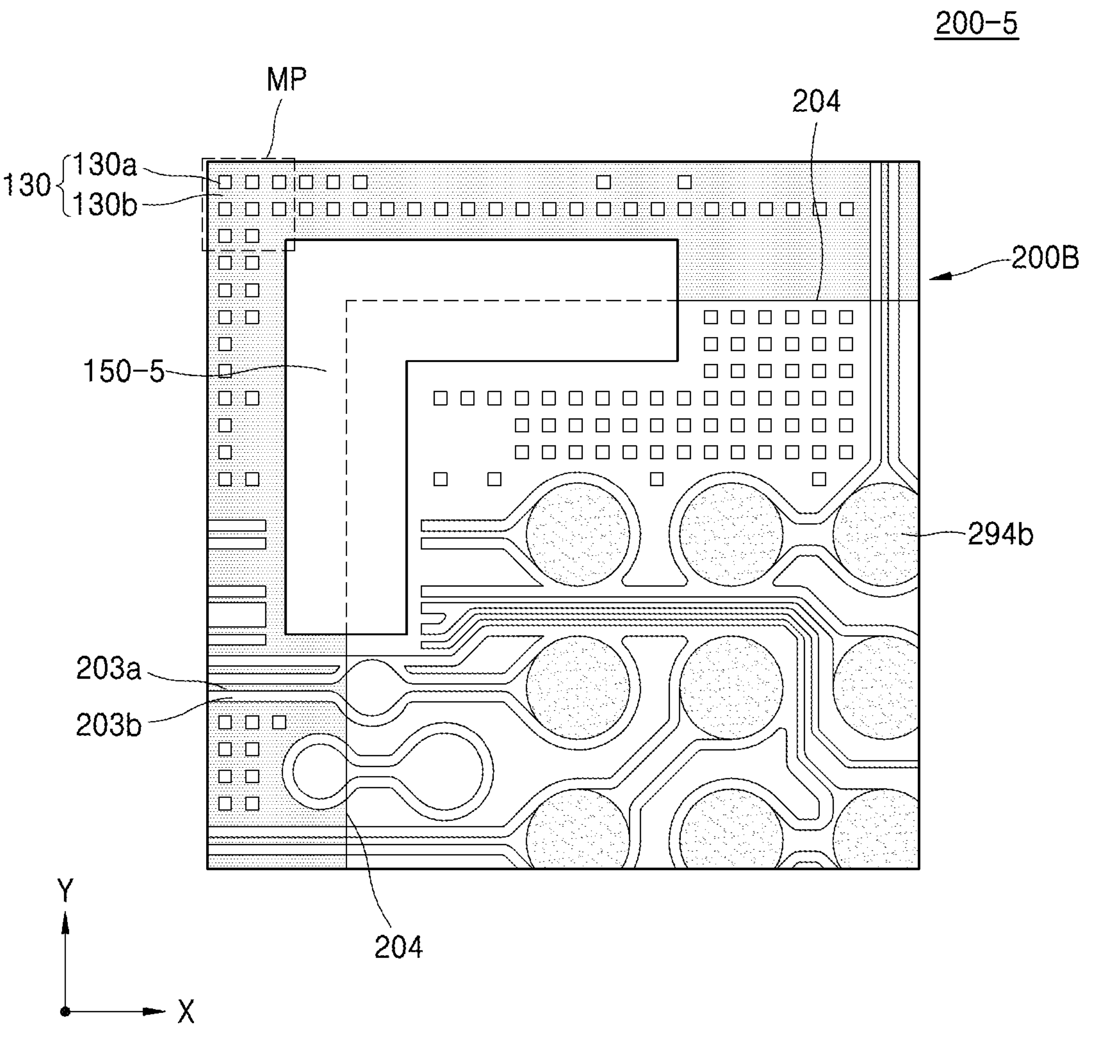
FIG. 11 is an enlarged view of a portion B of a lower package of FIG. 10.

FIG. 10 is a schematic plan view of a POP type semiconductor package according to some embodiments of the inventive concept. FIG. 11 is an enlarged view of a portion B of a lower package of FIG. 10. FIG. 11 does not show an upper package.

A semiconductor package 200-5 of FIGS. 10 and 11 may be similar to the semiconductor package 200 of FIGS. 1 to 3 but may include alignment marks 150-5 having a different shape.

The shape of the alignment marks 150-5 of FIGS. 10 and 11 may also be applicable to a shape of the alignment marks 150a of FIGS. 4 and 5. In some embodiments, the alignment marks 150*a* of FIGS. 4 and 5 may have a shape similar to or the same as the shape of the alignment marks 150-5 of FIGS. 10 and 11.

Portions of FIGS. 10 and 11 that are similar to or the same as those of FIGS. 1 to 3 may be briefly described or may not be described. The semiconductor package 200 includes a lower package 200B and an upper package 200T on the lower package 200B.

The semiconductor package 200-5 may include a mesh pattern 130 and an upper redistribution layer 203*a*. In the semiconductor package 200-5, the alignment marks 150-5 are positioned below and near outer boundaries of the upper package 200T on the lower package 200B.

The alignment marks 150-5 may be formed in a clamp shape (or L-shaped form). A shape of portions of the alignment marks 150-5 covered by (e.g., overlapped by) the upper package 200T on the lower package 200B is not limited. The portions of the alignment marks 150-5 covered by the upper package 200T may have various shapes different from the shape shown in FIGS. 10 and 11.

In other words, when the upper package 200T is mounted on the lower package 200B, the alignment marks 150-5 may have various forms when the alignment marks 150-5 are exposed. In this case, in the semiconductor package 200-5, misalignment between the lower package 200B and the upper package 200T may be detected using the alignment marks 150-5. In some embodiments, portions of the alignment marks 150-5 that are not overlapped by the upper package 200T after the upper package 200T is mounted may have various shapes, and these portions of the alignment marks 150-5 may be used to detect misalignment between the lower package 200B and the upper package 200T.

Accordingly, in the semiconductor package 200-5, the upper package 200T may be precisely aligned on the lower package 200B.

Figure 12:
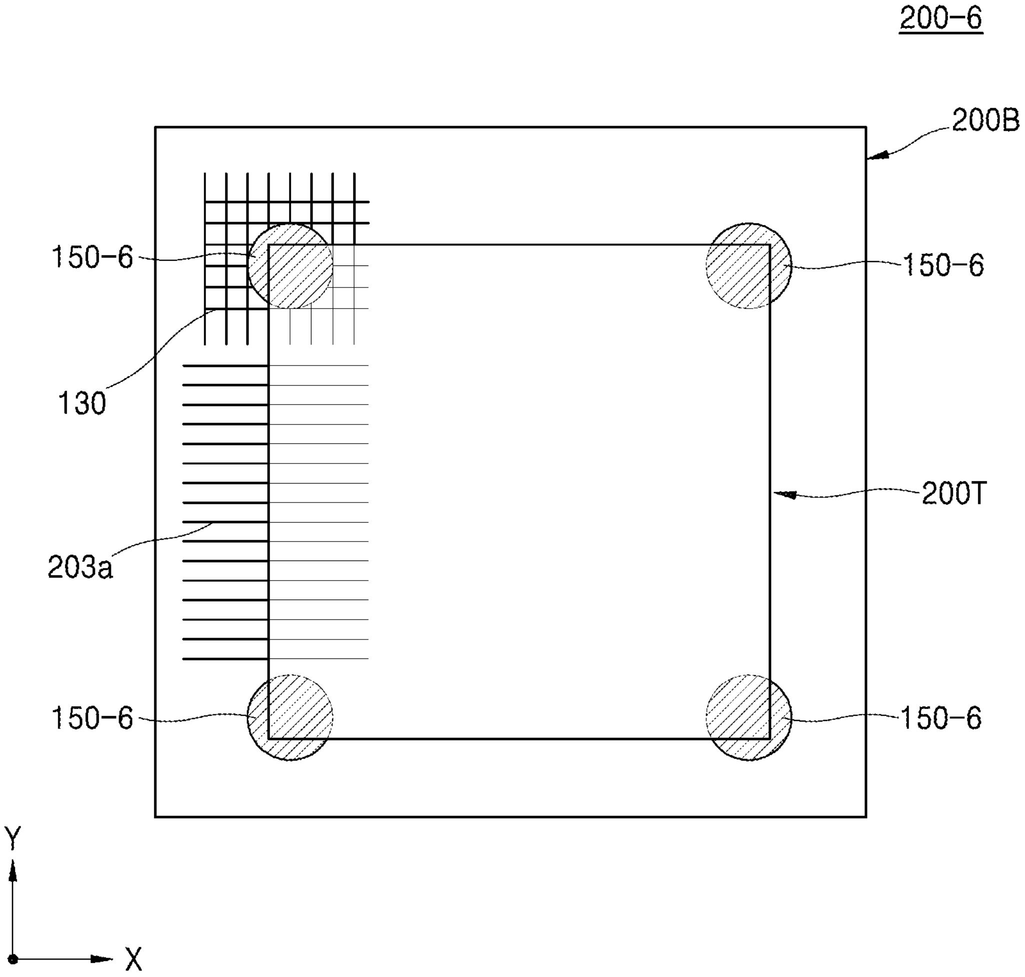
FIGS. 12 and 13 are schematic plan views of POP-type semiconductor packages according to some embodiments of the inventive concept.
Figure 13:
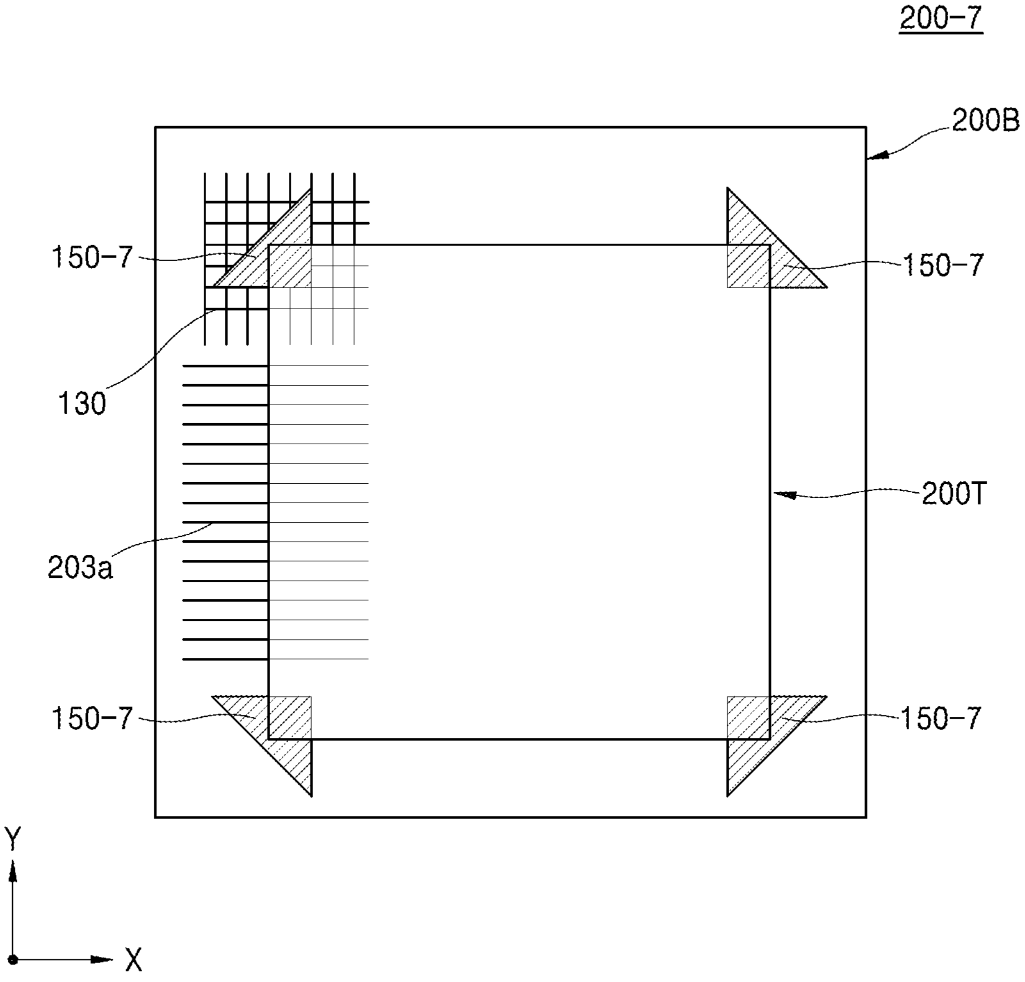

FIGS. 12 and 13 are schematic plan view of POP type semiconductor packages according to some embodiments of the inventive concept.

Semiconductor packages 200-6 and 200-7 of FIGS. 12 and 13 may be similar to the semiconductor package 200 of FIGS. 1 to 3 but may include alignment marks 150-6 and 150-7 having different shapes.

The shapes of the alignment marks 150-6 and 150-7 of FIGS. 12 and 13 may also be applicable to a shape of the alignment marks 150*a* of FIGS. 4 and 5. In some embodiments, the alignment marks 150*a* of FIGS. 4 and 5 may have a shape the same as the shapes of the alignment marks 150-6 and 150-7 of FIGS. 12 and 13.

Portions of FIGS. 12 and 13 that are similar to or the same as those of FIGS. 1 to 3 may be briefly described or may not be described. The semiconductor packages 200-6 and 200-7 may each include a lower package 200B and an upper package 200T on the lower package 200B.

The semiconductor packages 200-6 and 200-7 may each include a mesh pattern 130 and an upper redistribution layer 203*a*. In the semiconductor packages 200-6 and 200-7, the alignment marks 150-6 and 150-7 are positioned below and near outer boundaries of the upper package 200T on the lower package 200B.

The alignment marks 150-6 of FIG. 12 may have a round shape.

In some embodiments, the alignment marks 150-6 may be provided at all corners of the upper package 200T at the top of the lower package 200B. The alignment marks 150-7 of FIG. 13 may have a triangular shape.

In some embodiments, the alignment marks 150-7 may be formed at all corners of the upper package 200T on the lower package 200B. A shape of portions of the alignment marks 150-6 and 150-7 hidden by (e.g., overlapped by) the upper package 200T on the lower package 200B is not limited. In some embodiments, the portions of the alignment marks 150-6 and 150-7 overlapped by the upper package 200T may have shapes different from the shapes shown in FIG. 13.

In other words, when the upper package 200T is mounted on the lower package 200B, the alignment marks 150-6 and 150-7 may have various forms when the alignment marks 150-6 and 160-7 are exposed. In this case, in the semiconductor packages 200-6 and 200-7, misalignment between the lower package 200B and the upper package 200T may be detected using the alignment marks 150-6 and 150-7. In some embodiments, portions of the alignment marks 150-6 and 150-7 that are not overlapped by the upper package 200T after the upper package 200T is mounted may have various shapes, and these portions of the alignment marks 150-6 and 150-7 may be used to detect misalignment between the lower package 200B and the upper package 200T.

In addition, in the semiconductor packages 200-6 and 200-7, the upper package 200T may be precisely aligned on the lower package 200B by using the alignment marks 150-6 and 150-7.

In some embodiments, each of alignment marks (e.g., 150, 150*a*, and 150-1 through 150-7) according to some embodiments of the inventive concept includes a first portion overlapped by an upper package (e.g., 200T and 200T') and a second portion not overlapped by the upper package, and the first portions of the alignment marks may have an identical shape, and the second portions of the alignment marks may have an identical shape. For example, the first portions of the alignment marks 150-7 has a shape of two tringles connected to each other, and the second portion of the alignment marks 150-7 has a rectangular shape as illustrated in FIG. 13.

FIGS. 14 to 18 are schematic cross-sectional views illustrating a manufacturing method of a POP type semiconductor package according to some embodiments of the inventive concept.

Specifically, in FIGS. 14 to 18, a manufacturing method of the semiconductor package 300 of FIG. 4 will be described.

Figure 14:
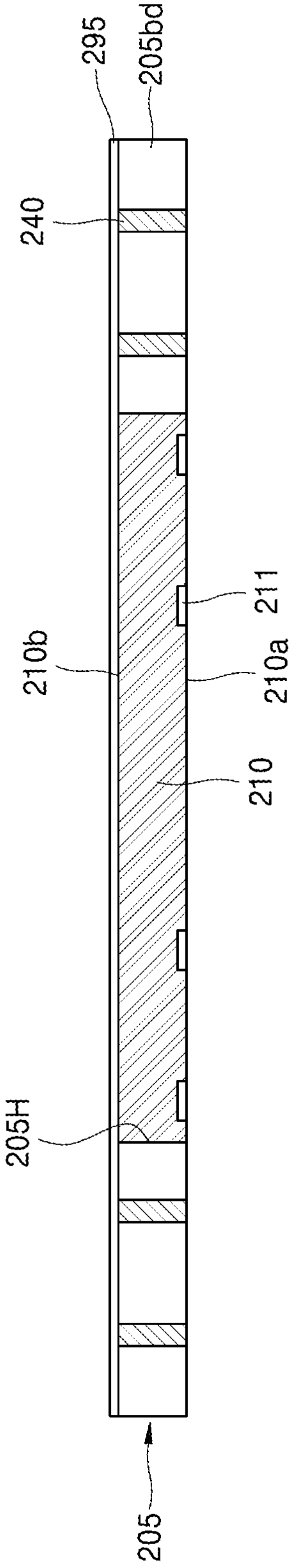
FIGS. 14 to 18 are schematic cross-sectional views illustrating a method of manufacturing a POP-type semiconductor package according to some embodiments of the inventive concept.

The manufacturing method of FIGS. 14 to 18 may be applicable to a manufacturing method of the semiconductor package 200 of FIGS. 1 to 3. Referring to FIG. 14, a lower package substrate 205 with a cavity 205H in which a lower semiconductor chip 210 is to be accommodated may be provided.

A lower semiconductor chip 210 may be provided in the cavity 205H. The lower semiconductor chip 210 may include an active surface 210*a* and an inactive surface 210*b* opposite to the active surface 210*a*. A chip pad 211 may be formed on the active surface 210*a*. A fixing member 295 may be provided on one surface of the lower package substrate 205 to fix the lower semiconductor chip 210.

The fixing member 295 may be in the form of a film or in the form of a support plate. The lower package substrate 205 may include a lower package substrate body 205*bd*.

Figure 15:
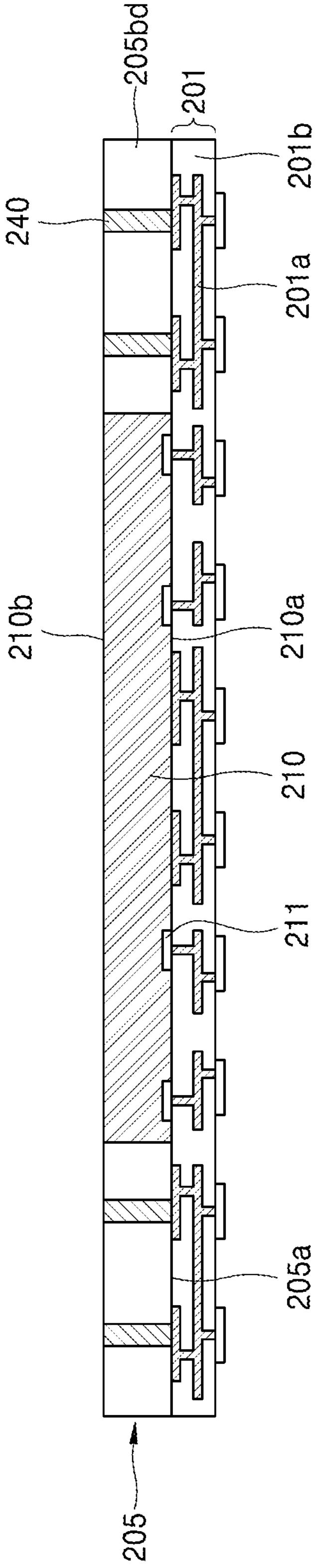

A conductive via 240 may be provided in the lower package substrate body 205*bd*. The conductive via 240 may be formed before or after the lower semiconductor chip 210 is disposed. Referring to FIG. 15, after removing the fixing member 295, a lower redistribution structure 201 may be formed on an exposed first surface of the lower package substrate 205 and a surface of the lower semiconductor chip 210.

Although an example in which the lower redistribution structure 201 is first formed is described herein, an upper redistribution structure 203 to be described later may be formed before the lower redistribution structure 201 is formed. A lower redistribution insulating layer 201b may be formed to form the lower redistribution structure 201.

The redistribution insulating layer 201b may be patterned to serve as a mold. Subsequently, a seed metal layer may be formed in the patterned redistribution insulating layer 201b, and a lower redistribution layer 201a may be formed by a plating method such as electrolytic plating, electroless plating, or immersion plating. This process may be performed once or may be performed a plurality of times when necessary.

Figure 16:
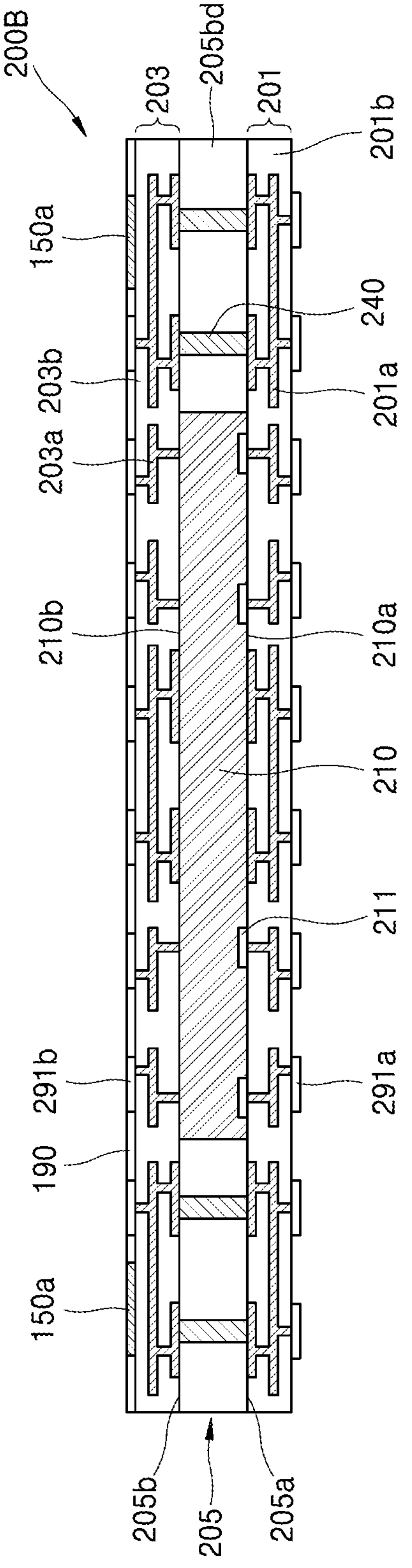

As a method of forming the lower redistribution structure 201 is well known to those of ordinary skill in the art and thus a detailed description thereof will be omitted here. Referring to FIG. 16, an upper redistribution structure 203 may be formed on a second surface 205b, which is an opposite surface of the lower package substrate 205, in the same manner described with reference to FIG. 15.

The upper redistribution structure 203 may include an upper redistribution layer 203a and an upper redistribution insulating layer 203b. A method of forming the upper redistribution structure 203 has been described with reference to FIG. 16 and thus is not redundantly described herein. A second cover layer 190 may be formed on the upper redistribution structure 203.

The second cover layer 190 may be, for example, a transparent organic layer. The second cover layer 190 may be, for example, a photo imageable dielectric (PID) layer. After the second cover layer 190 is patterned to form a plurality of contact holes exposing the upper redistribution layer 203a, alignment marks 150a and a second external connection pad 291b may be formed in the contact holes. The second external connection pad 291b may be formed on a position to be electrically connected to the upper redistribution layer 203a.

Figure 17:
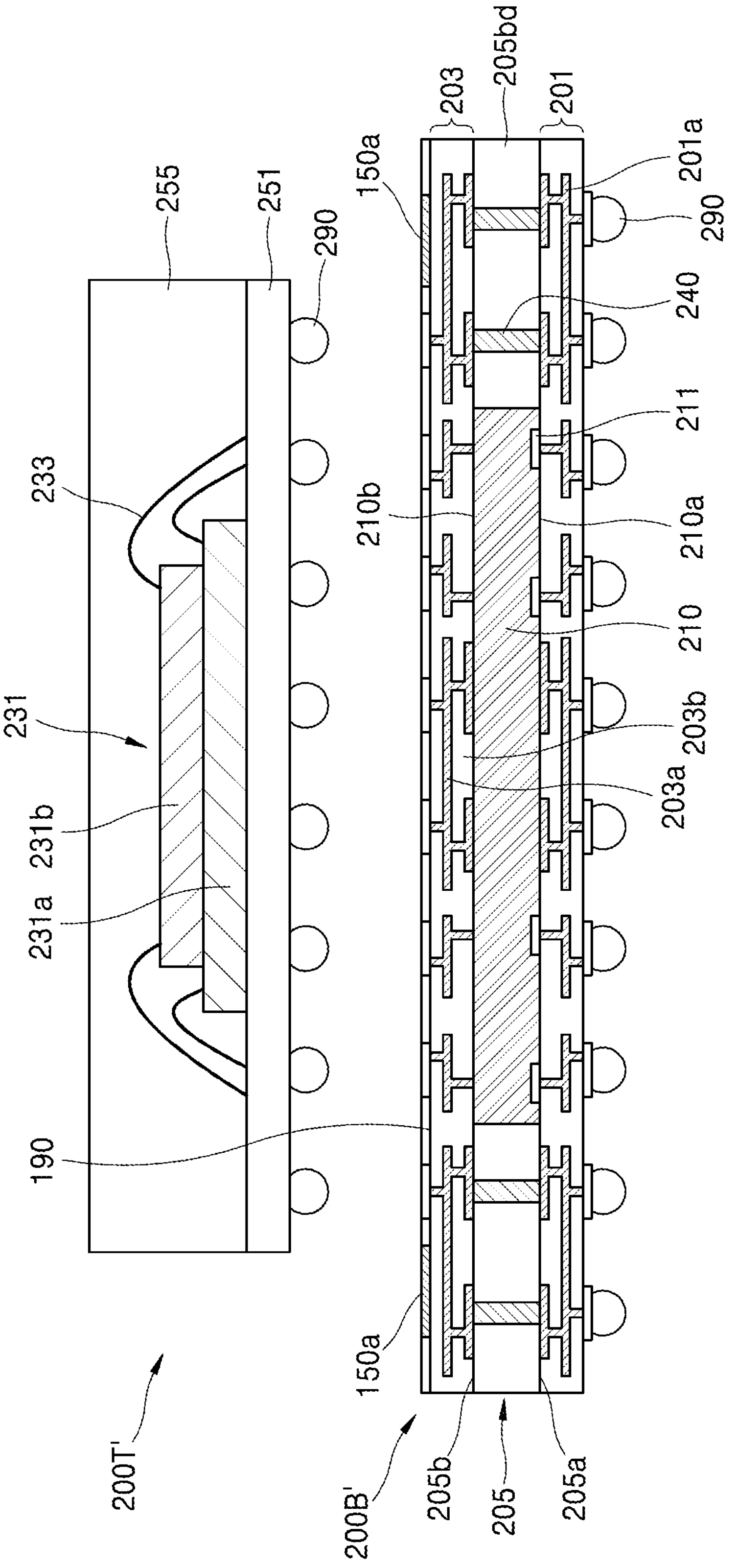
Figure 18:
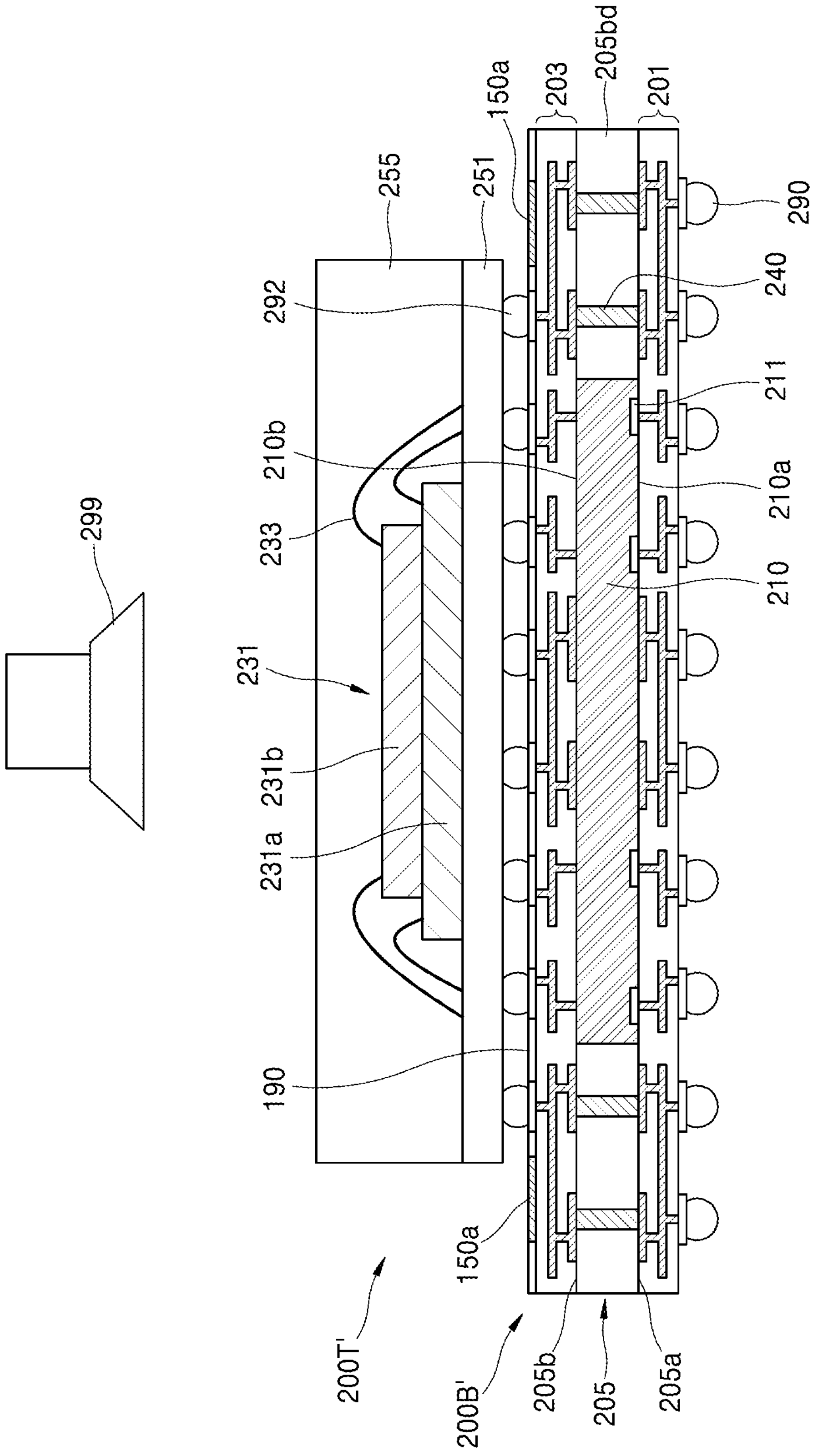

The alignment marks 150a may be formed at or adjacent to boundary portions (e.g., an outline) of an upper package to be mounted later. The alignment marks 150a may not be electrically connected to the upper redistribution layer 203a. Referring to FIGS. 17 and 18, an upper package 200T' may be provided on a lower package 200B' as illustrated in FIG. 17.

In the upper package 200T', an upper semiconductor chip 231 is mounted on an upper package substrate 251 via bonding wires 233. The upper package 200T' may be similar to or substantially the same as the upper package 200T' of FIG. 4, and thus a detailed description thereof may be omitted here. Next, as illustrated in FIG. 18, the upper package 200T' is mounted on the lower package 200B'.

After mounting the upper package 200T', misalignment between the lower package 200B' and the upper package 200T' may be detected by photographing the alignment marks 150 on the lower package 200B' by using, for example, a vision camera 299. Thereafter, when no misalignment occurs between the lower package 200B' and the upper package 200T', a POP type semiconductor package 300 as illustrated in FIG. 4 may be obtained by heating the upper package 200T' and the lower package 200B' to be pressed against each other.

Figure 19:
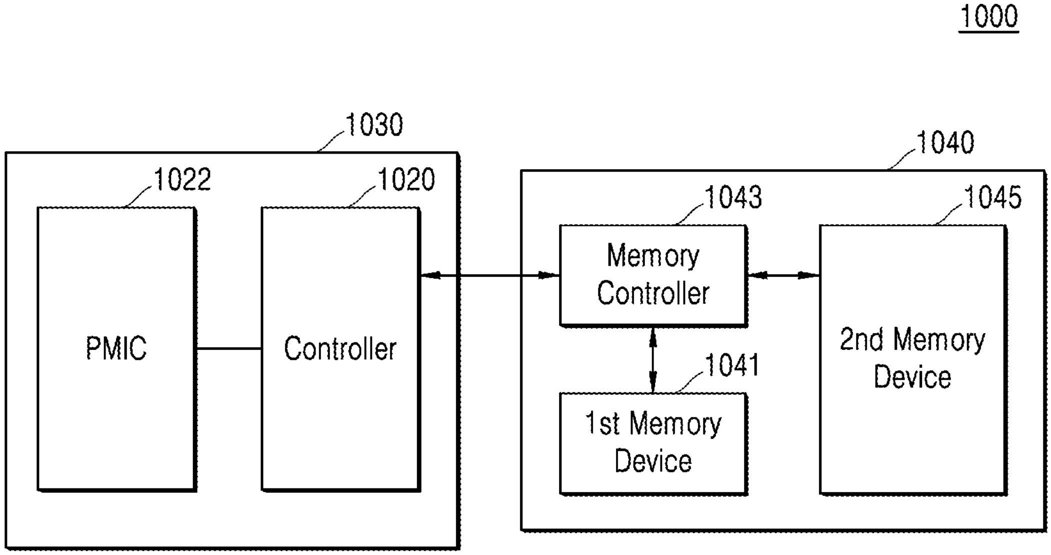
FIG. 19 is a block diagram of a POP-type semiconductor package according to some embodiments of the inventive concept.

FIG. 19 is a block diagram of a POP type semiconductor package according to some embodiments of the inventive concept.

A semiconductor package 1000 may correspond to the POP type semiconductor package (e.g., 200, 300 or 400) according to some embodiments of the inventive concept.

The semiconductor package 1000 may include a controller chip 1020, a first memory chip (or first memory device) 1041, a second memory chip 1045, and a memory controller 1043. The semiconductor package 1000 may further include a power management integrated circuit (PMIC) or power management chip 1022 to supply operating voltages to the controller chip 1020, the first memory chip 1041, the second memory chip 1045, and the memory controller 1043.

The operating voltages applied to the components may be designed to be the same or different. A lower package 1030 which includes the controller chip 1020 and the power management chip 1022 may be the lower package 200B, 200B' or 200B" according to some embodiments of the inventive concept described herein.

An upper package 1040 which includes the first memory chip 1041, the second memory chip 1045, and the memory controller 1043 may be the upper package 200T or 200T' according to some embodiments of the inventive concept described herein. The semiconductor package 1000 may be embodied as being included in, for example, a personal computer (PC) or a mobile device.

The mobile device may be embodied as, for example, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet-of-things (IoT) device, an Internet-of-everything (IoE) device, or a drone. The controller chip 1020 may control an operation of each of the first memory chip 1041, the second memory chip 1045, and the memory controller 1043.

For example, the controller chip 1020 may be embodied as, for example, an integrated circuit (IC), a system-on-chip (SoC), an application processor (AP), a mobile AP, a chipset, or a set of chips. For example, the controller 20 may include a central processing unit (CPU), a graphics processing unit (GPU), and/or a modem. In some embodiments, the controller chip 1020 may perform a function of a modem and a function of an AP. The memory controller 1043 may control the second memory chip 1045 under control of the controller chip 1020.

The first memory chip 1041 may be embodied as, for example, a volatile memory device. The volatile memory device may be embodied as, for example, random access memory (RAM), dynamic RAM (DRAM), or static RAM (SRAM) but the inventive concept is not limited thereto. The second memory chip 1045 may be embodied as, for example, a storage memory device. The storage memory device may be embodied as, for example, a nonvolatile memory device. The storage memory device may be embodied as, for example, a flash-based memory device but the inventive concept is not limited thereto.

The second memory chip 1045 may be embodied as, for example, a NAND-type flash memory device. The NAND-type flash memory device may include a two-dimensional (2D) memory cell array or a three-dimensional (3D) memory cell array. The 2D memory cell array or the 3D memory cell array may include a plurality of memory cells, and each of the plurality of memory cells may store 1-bit information or 2-bit or more information. When the second memory chip 1045 is embodied as a flash-based memory device, the memory controller 1043 may use (or support) a multimedia card interface (MMC) interface, an embedded MMC (eMMC) interface, or a universal flash storage (UFS) interface, but the inventive concept is not limited thereto.

Figure 20:
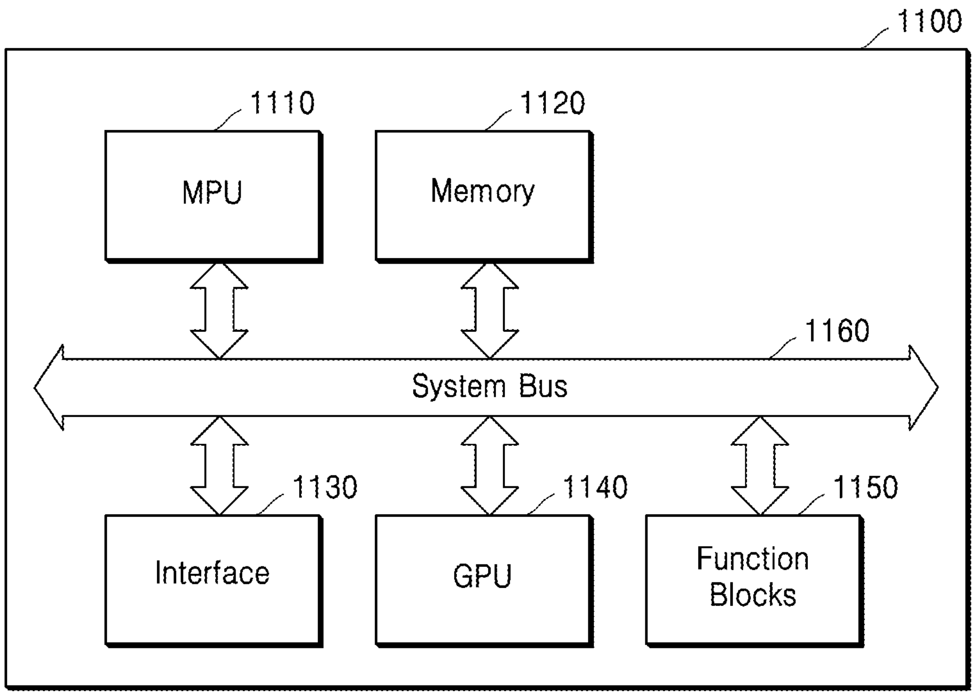
FIG. 20 is a schematic block diagram of a POP-type semiconductor package according to some embodiments of the inventive concept.

FIG. 20 is a schematic block diagram of a POP type semiconductor package according to some embodiments of the inventive concept.

A semiconductor package 1100 may include a micro-processing unit 1110, a memory 1120, an interface 1130, a graphic processing unit 1140, functional blocks 1150, and a bus 1160 connecting these components to one another.

In some embodiments, the semiconductor package 1100 may include both the micro-processing unit 1110 and the graphic processing unit 1140 or may include only one of the micro-processing unit 1110 and the graphic processing unit 1140. The micro-processing unit 1110 may include, for example, a core and an L2 cache.

For example, the micro-processing unit 1110 may include a multi-core. Cores of the multi-core may have the same or different performance. In addition, the cores of the multi-core may be activated at the same time or different times. The memory 1120 may store a result of processing performed by the functional blocks 1150 under control of the micro-processing unit 1110. For example, in the micro-processing unit 1110, when content stored in the L2 cache is flushed, the content may be stored in the memory 1120. The interface 1130 may interface with external devices. For example, the interface 1130 may interface with a camera, an LCD, a speaker, and the like. The graphics processing unit 1140 may perform graphics functions.

For example, the graphics processing unit 1140 may implement a video codec or process 3D graphics. The function blocks 1150 may perform various functions. For example, when the semiconductor package 1100 is an Application Processor (AP) used in a mobile device, some of the functional blocks 1150 may perform a communication function. The semiconductor package 1100 may be the semiconductor package (e.g., 200, 300, or 400) according to some embodiments of the inventive concept described herein.

The micro-processing unit 1110 and/or the graphics processing unit 1140 may be the lower package (200B, 200B', or 200B" described herein. The memory 1120 may be the upper package 200T or 200T' described herein. The interface 1130 and the functional blocks 1150 may correspond part of the lower package 200B, 200B', or 200B" described herein.

While the inventive concept has been particularly shown and described with reference to some example embodiments thereof, it will be understood that various changes in form and details may be made therein without departing from the scope of the following claims.

What is claimed is:

1. A package-on-package (POP)-type semiconductor package comprising:

a lower package substrate;

an upper redistribution structure having a first size and alignment marks, wherein the upper redistribution structure and the alignment marks are on the lower package substrate;

an upper package substrate having a second size smaller than the first size;

an upper semiconductor chip on the upper package substrate; and a conductive via to electrically connect the lower package substrate and the upper redistribution structure;

wherein the alignment marks indicate an outline of the upper package substrate, and the alignment marks are below and adjacent to the outline of the upper package substrate, the alignment marks are between the lower package substrate and the upper package substrate, and at least one of the alignment marks comprises a first portion overlapped by the upper package substrate and a second portion not overlapped by the upper package substrate.

2. The POP-type semiconductor package of claim 1, wherein the upper redistribution structure comprises an upper redistribution layer and an upper redistribution insulating layer, and the upper redistribution insulating layer is a transparent organic layer, and wherein the alignment marks are in the upper redistribution insulating layer and at a level equal to the upper redistribution layer, and the alignment marks comprise a material the same as a material of the upper redistribution layer.

3. The POP-type semiconductor package of claim 1, wherein the alignment marks comprise two alignment marks that are below and adjacent to two opposing corner portions of the upper package substrate, respectively.

4. The POP-type semiconductor package of claim 1, wherein the at least one of the alignment marks is a solid pattern identifiable by a vision camera.

5. The POP-type semiconductor package of claim 1, wherein the at least one of the alignment marks has a triangular, quadrangular, circular or clamp shape.

6. The POP-type semiconductor package of claim 1, further comprises a lower semiconductor chip embedded in the lower package substrate.

7. A package-on-package (POP)-type semiconductor package comprising:

a lower package substrate;

an upper redistribution structure having a first size and alignment marks on the lower package substrate, wherein the upper redistribution structure and the alignment marks are on the lower package substrate; and an upper package substrate having a second size smaller than the first size, wherein the upper package substrate is mounted on the upper redistribution structure and is electrically connected to the upper redistribution structure, wherein the alignment marks indicate an outline of the upper package substrate, and the alignment marks are below and adjacent to the outline of the upper package substrate, the alignment marks are between the lower package substrate and the upper package substrate, and at least one of the alignment marks comprises a first portion overlapped by the upper package substrate and a second portion not overlapped by the upper package substrate.

8. The POP-type semiconductor package of claim 7, wherein the upper package substrate has a quadrangular shape, and the at least one of the alignment marks is below and adjacent to a respective one of two opposing corner portions of the upper package substrate.

9. The POP-type semiconductor package of claim 7, wherein the at least one of the alignment marks is a solid pattern identifiable by a vision camera.

10. The POP-type semiconductor package of claim 7, wherein the at least one of the alignment marks has a triangular, quadrangular, circular or clamp shape.

11. The POP-type semiconductor package of claim 7, wherein the alignment marks comprise two alignment marks that are below and adjacent to two opposing corner portions of the upper package substrate, respectively.

12. The POP-type semiconductor package of claim 7, wherein the first portions of the alignment marks have an identical shape.

13. The POP-type semiconductor package of claim 7, wherein the second portions of the alignment marks have an identical shape.

14. The POP-type semiconductor package of claim 7, wherein the upper redistribution structure comprises an upper redistribution layer and an upper redistribution insulating layer, and the upper redistribution insulating layer is a transparent organic layer.

15. The POP-type semiconductor package of claim 14, wherein the alignment marks are in the upper redistribution insulating layer and at a level equal to the upper redistribution layer, and the alignment marks comprise a material the same as a material of the upper redistribution layer.

* * * * *